US011711971B2

(12) United States Patent
Jung et al.

(10) Patent No.: US 11,711,971 B2
(45) Date of Patent: Jul. 25, 2023

(54) INK COMPOSITION AND METHOD FOR MANUFACTURING ORGANIC LIGHT EMITTING DEVICE

(71) Applicant: LG Chem, Ltd., Seoul (KR)

(72) Inventors: Ji Young Jung, Daejeon (KR); Mi Kyoung Kim, Daejeon (KR)

(73) Assignee: LG Chem, Ltd.

(*) Notice: Subject to any disclaimer, the term of this patent is extended or adjusted under 35 U.S.C. 154(b) by 642 days.

(21) Appl. No.: 16/497,584

(22) PCT Filed: Nov. 30, 2018

(86) PCT No.: PCT/KR2018/015063
§ 371 (c)(1),
(2) Date: Sep. 25, 2019

(87) PCT Pub. No.: WO2019/117516
PCT Pub. Date: Jun. 20, 2019

(65) Prior Publication Data
US 2020/0295263 A1    Sep. 17, 2020

(30) Foreign Application Priority Data

Dec. 12, 2017  (KR) ................. 10-2017-0170407
Nov. 20, 2018  (KR) ................. 10-2018-0143421

(51) Int. Cl.
| C09D 11/36 | (2014.01) |
| H10K 85/60 | (2023.01) |
| C09D 11/38 | (2014.01) |
| C09K 11/06 | (2006.01) |
| H10K 71/00 | (2023.01) |
| H10K 71/15 | (2023.01) |
| H10K 71/13 | (2023.01) |

(52) U.S. Cl.
CPC .......... *H10K 85/633* (2023.02); *C09D 11/36* (2013.01); *C09D 11/38* (2013.01); *C09K 11/06* (2013.01); *H10K 71/00* (2023.02); *H10K 71/135* (2023.02); *H10K 71/15* (2023.02); *H10K 85/626* (2023.02)

(58) Field of Classification Search
CPC .................................................. H01L 51/006
See application file for complete search history.

(56) References Cited

U.S. PATENT DOCUMENTS

| 6,156,451 A | 12/2000 | Banerjee et al. |
| 7,704,785 B2 | 4/2010 | Steiger et al. |
| 7,820,077 B2 | 10/2010 | Spreitzer et al. |
| 9,263,680 B2 | 2/2016 | Caille et al. |
| 9,583,714 B2 | 2/2017 | Funyuu et al. |
| 2009/0033208 A1* | 2/2009 | Nagayama .......... H01L 51/0007 313/504 |
| 2009/0066223 A1* | 3/2009 | Yabe .................... H01L 51/008 252/301.16 |
| 2015/0094437 A1* | 4/2015 | Caille .................. C07C 211/54 548/440 |
| 2015/0132496 A1 | 5/2015 | Son |
| 2017/0207282 A1 | 7/2017 | Kishimoto et al. |
| 2017/0226294 A1 | 8/2017 | Kim et al. |
| 2018/0375029 A1* | 12/2018 | Béalle .................... C09D 11/38 |
| 2019/0127327 A1 | 5/2019 | Bae et al. |
| 2020/0127203 A1* | 4/2020 | Béalle .................... H10K 71/15 |

FOREIGN PATENT DOCUMENTS

| CN | 104638198 A | 5/2015 |
| CN | 105733562 A | 7/2016 |
| CN | 108369997 A | 8/2018 |
| JP | 2015511215 A | 4/2015 |
| JP | 2019506732 A | 3/2019 |
| KR | 20070001138 A | 1/2007 |
| KR | 20070004958 A | 1/2007 |
| KR | 20090117078 A | 11/2009 |
| KR | 20140107594 A | 9/2014 |
| KR | 20150091424 A | 8/2015 |
| KR | 20160117249 A | 10/2016 |
| KR | 20170120925 A | 11/2017 |
| KR | 20190069993 A | 6/2019 |
| WO | 2006087945 A1 | 8/2006 |
| WO | 2017102048 A1 | 6/2017 |
| WO | 2017102049 A1 | 6/2017 |
| WO | WO 2017/102048 * | 6/2017 |
| WO | 2018104202 A1 | 6/2018 |
| WO | 2019124413 A1 | 6/2019 |

OTHER PUBLICATIONS

International Search Report from Application No. PCT/KR2018/015063 dated Mar. 8, 2019, pp. 1-3.
Lengvinaite, S. et al., "Cross-linkable fluorenyl-substituted aromatic amines for polymeric hole transporting networks", Reactive & Functional Polymers, vol. 71, Issue 5, May 2011, pp. 574-578.
Chinese Search Report for Application No. 201880020867.X dated Jul. 23, 2021, 9 pgs.

* cited by examiner

*Primary Examiner* — Austin Murata
(74) *Attorney, Agent, or Firm* — Lerner David LLP

(57) ABSTRACT

The present specification relates to an ink composition comprising a solvent comprising a solvent represented by Chemical Formula 1, a solvent represented by Chemical Formula 2 and a solvent represented by Chemical Formula 3; and a charge transferring material or a light emitting material, and a method for manufacturing an organic light emitting device formed using the ink composition.

14 Claims, 2 Drawing Sheets

[FIG. 1]
| 701 |
|---|
| 601 |
| 501 |
| 401 |
| 301 |
| 201 |
| 101 |
[FIG. 2]
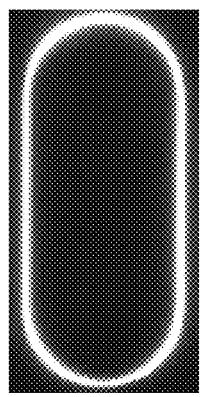

[FIG. 3]
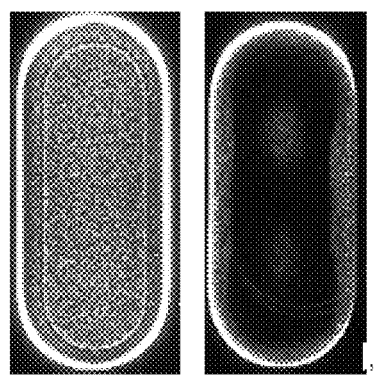
[FIG. 4]
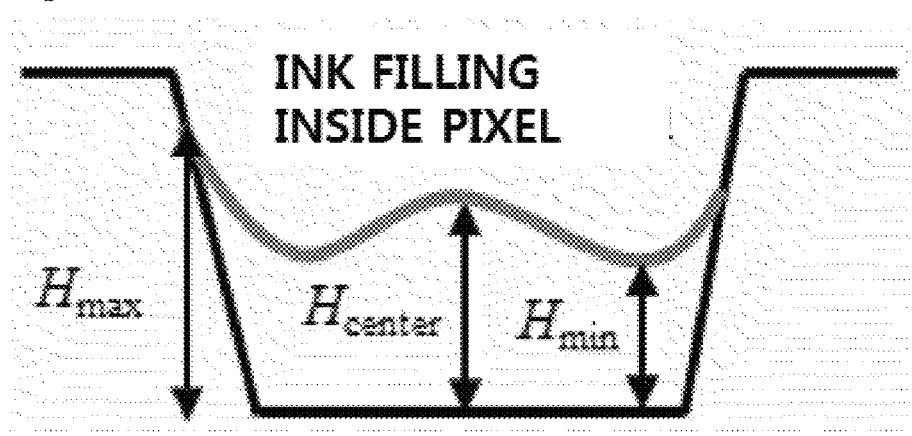
[FIG. 5]
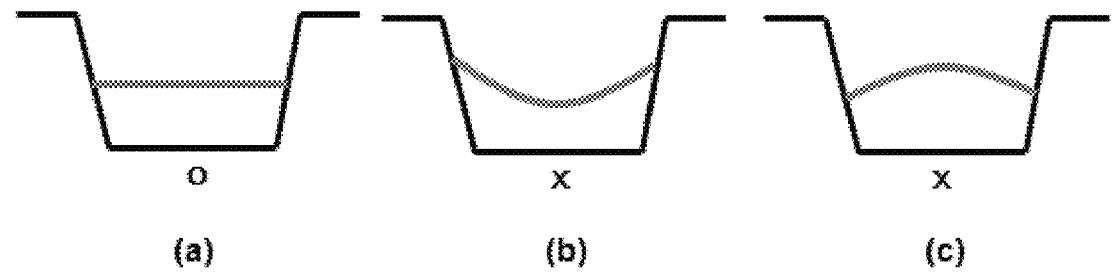

INK COMPOSITION AND METHOD FOR MANUFACTURING ORGANIC LIGHT EMITTING DEVICE

CROSS-REFERENCE TO RELATED APPLICATIONS

The present application is a national phase entry under 35 U.S.C. § 371 of International Application No. PCT/KR2018/015063 filed Nov. 30, 2018, which claims priority from Korean Patent Application No. 10-2017-0170407 filed Dec. 12, 2017 and Korean Patent Application No. 10-2018-0143421 filed Nov. 20, 2018, all of which are incorporated herein by reference.

TECHNICAL FIELD

The present specification relates to an ink composition comprising a solvent comprising a solvent represented by Chemical Formula 1, a solvent represented by Chemical Formula 2 and a solvent represented by Chemical Formula 3; and a charge transferring material or a light emitting material, and a method for manufacturing an organic light emitting device formed using the ink composition.

BACKGROUND ART

Attempts to manufacture an organic light emitting device through a solution process have been ongoing, and manufacturing an organic light emitting device using an inkjet printing process that is economical and stable has received attention as precise pattern formation has been required with minimized material consumption, smaller devices or increased display resolution.

An ink composition used in an inkjet printing process needs to be stably discharged, needs to have no phase separation between a functional material such as a charge transfer material or a light emitting material and a solvent, and needs to form a uniform film when forming a film.

Ether-based solvents or hydrocarbon-based solvents having relatively low polarity have been much used in the ink composition in the art, and for example, solvents such as phenoxytoluene or cyclohexylbenzene have been used. However, using the above-mentioned solvent as a main solvent has had a limit in increasing a solid content of the ink due to low solubility for a functional material, which leads to a problem in that a process takes a long time, and a stable film is not able to be formed with phase separation occurring when drying. In addition, when a solvent has low solubility for a functional material, the amount of the functional material capable of being dissolved in the ink is limited, and in order to obtain a target thickness, the number of drops that need to be dropped on pixels increases, and as a result, it is difficult to obtain a flat profile and a target thickness.

In addition, even when having high solubility for a functional material, a solvent used in an ink composition needs to have a high boiling point in order to prevent a problem of a nozzle unit being dried. For example, cyclohexanone is considered as a solvent having favorable solubility, but has a low boiling point, and therefore, is not suited in an inkjet process since a nozzle unit is dried when used in an ink composition.

Accordingly, development of an ink composition including a solvent having excellent solubility for a functional material and having a high boiling point has been required in the art.

DISCLOSURE

Technical Problem

The present specification is directed to providing an ink composition usable in an organic light emitting device, and a method for manufacturing an organic light emitting device using the same.

Technical Solution

One embodiment of the present specification provides an ink composition comprising a solvent comprising a solvent represented by the following Chemical Formula 1, a solvent represented by the following Chemical Formula 2, and a solvent represented by the following Chemical Formula 3; and a charge transferring material or a light emitting material.

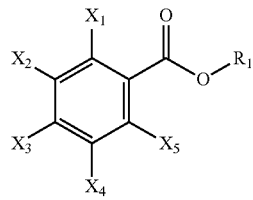

[Chemical Formula 1]

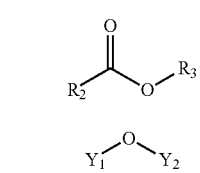

[Chemical Formula 2]

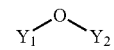

[Chemical Formula 3]

In Chemical Formulae 1 to 3, $X_1$ to $X_5$ are the same as or different from each other, and each independently hydrogen; deuterium; a substituted or unsubstituted alkyl group; a substituted or unsubstituted cycloalkyl group; a substituted or unsubstituted cycloalkenyl group; a substituted or unsubstituted alkoxy group; a substituted or unsubstituted ester group; or a substituted or unsubstituted aryl group, and at least one of $X_1$ to $X_5$ is a substituted or unsubstituted alkyl group; a substituted or unsubstituted ester group; or a substituted or unsubstituted alkoxy group, $R_1$ is a substituted or unsubstituted alkyl group; a substituted or unsubstituted cycloalkyl group; a substituted or unsubstituted cycloalkenyl group; or a substituted or unsubstituted aryl group, $R_2$ is a substituted or unsubstituted alkyl group; a substituted or unsubstituted cycloalkyl group; a substituted or unsubstituted cycloalkenyl group; or a substituted or unsubstituted aryl group, $R_3$ is a substituted or unsubstituted alkyl group; a substituted or unsubstituted cycloalkyl group; or a substituted or unsubstituted cycloalkenyl group, when $R_2$ is a substituted or unsubstituted aryl group, $R_3$ is a substituted or unsubstituted alkyl group having 4 to 15 carbon atoms, and $Y_1$ and $Y_2$ are the same as or different from each other, and each independently hydrogen; deuterium; a hydroxyl group; a carbonyl group; an ester group; a substituted or unsubstituted alkyl group; a substituted or unsubstituted alkenyl group; a substituted or unsubstituted cycloalkyl group; a substituted or unsubstituted cycloalkenyl group; a substituted or unsubstituted alkoxy group; or a substituted or unsubstituted aryl group.

Another embodiment of the present specification provides a method for manufacturing an organic light emitting device comprising preparing a substrate; forming a cathode or an anode on the substrate; forming one or more organic material layers on the cathode or the anode; and forming an anode or a cathode on the organic material layers, wherein the forming of the organic material layers comprises forming one or more organic material layers using the ink composition.

Advantageous Effects

An ink composition according to one embodiment of the present specification has high solvent solubility for a functional material, and therefore, is capable of increasing a content of the functional material in the ink composition, and as a result, is capable of enhancing stability of the ink composition. In addition, by including some solvents having high boiling point properties, the ink composition is capable of forming a uniform film by controlling an evaporation rate during a drying process of the ink composition due to low vapor pressure properties.

DESCRIPTION OF DRAWINGS

FIG. 1 illustrates an example of an organic light emitting device according to one embodiment of the present specification.

FIG. 2 is a diagram showing a surface image of a film formed using an ink composition according to one embodiment of the present specification.

FIG. 3 is a diagram showing surface images of films formed using ink compositions according to comparative examples.

FIG. 4 is a diagram showing a thickness at each point of an ink filling inside a pixel for evaluating film center flatness.

FIG. 5 is a diagram showing shapes of inks filling inside pixels for evaluating edge shapes.

MODE FOR DISCLOSURE

Hereinafter, the present specification will be described in detail.

In the present specification, a description of one member being placed "on" another member comprises not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

In the present specification, a term "combination thereof" included in a Markush-type expression means a mixture or a combination of one or more selected from the group consisting of constituents described in the Markush-type expression, and means including one or more selected from the group consisting of the constituents.

In the present specification, a "photocuring group or thermal curing group" may mean a reactive substituent enabling crosslinking between compounds through an exposure to heat and/or light. The crosslinking may be produced by, through heat treatment or light irradiation, connecting radicals produced while carbon-carbon multiple bonds and cyclic structures are decomposed.

Hereinafter, substituents of the present specification will be described in detail.

In the present specification,

means a site bonding to other substituents or bonding sites.

In the present specification, a term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other. When two or more substituents are adjacent to each other, the adjacent groups may bond to each other to form an aromatic or aliphatic ring.

A term "substituted or unsubstituted" in the present specification means being substituted with one or more substituents selected from the group consisting of deuterium; a nitrile group; a nitro group; a hydroxyl group; a carbonyl group; an ester group; an alkyl group; a cycloalkyl group; a cycloalkenyl group; an alkoxy group; an alkenyl group; an aryl group; an amine group; and a heterocyclic group, or being unsubstituted, or being substituted with a substituent linking two or more substituents among the substituents illustrated above, or being unsubstituted. For example, "a substituent linking two or more substituents" may include a biphenyl group. In other words, a biphenyl group may be an aryl group, or interpreted as a substituent linking two phenyl groups.

In the present specification, the halogen group may be fluorine, chlorine, bromine or iodine.

In the present specification, the alkyl group may be linear or branched, and according to one embodiment, the number of carbon atoms of the alkyl group is from 1 to 20. According to another embodiment, the number of carbon atoms of the alkyl group is from 1 to 10. According to another embodiment, the number of carbon atoms of the alkyl group is from 1 to 6. Specific examples of the alkyl group may include a methyl group, an isopropyl group, a pentyl group, an n-butyl group, an isobutyl group, a t-butyl group or the like, but are not limited thereto. In one embodiment, the butyl group may be expressed as an amyl group.

In the present specification, the alkenyl group may be linear or branched, and although not particularly limited thereto, the number of carbon atoms is preferably from 2 to 40. According to one embodiment, the number of carbon atoms of the alkenyl group is from 2 to 20. According to another embodiment, the number of carbon atoms of the alkenyl group is from 2 to 10. According to another embodiment, the number of carbon atoms of the alkenyl group is from 2 to 6. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the alkoxy group may be linear, branched or cyclic. Although not particularly limited thereto, the number of carbon atoms of the alkoxy group may be from 1 to 20. Specifically, a methoxy group and the like may be included, however, the alkoxy group is not limited thereto.

The alkyl group, the alkoxy group and other substituents including an alkyl group part described in the present specification include both linear and or branched forms.

In the present specification, the number of carbon atoms of the carbonyl group is not particularly limited, but is preferably from 1 to 20. The carbonyl group may be expressed as $-COR_x$, and $R_x$ may be a substituted or unsubstituted alkyl group or a substituted or unsubstituted aryl group, but is not limited thereto. Specifically, $R_x$ may be a methyl ketone group or the like.

In the present specification, in the ester group, the oxygen of the ester group may be substituted with a linear, branched or cyclic alkyl group having 1 to 25 carbon atoms or an aryl group having 6 to 25 carbon atoms. Specifically, compounds of the following structural formulae may be included, however, the ester group is not limited thereto.

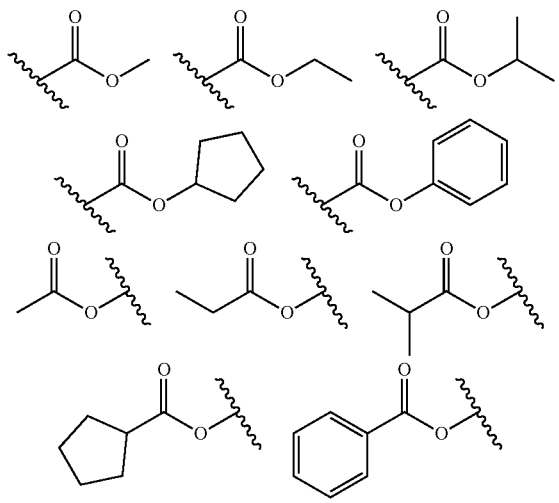

In the present specification, the cycloalkyl group is not particularly limited, however, according to one embodiment, the number of carbon atoms of the cycloalkyl group is from 3 to 40. According to another embodiment, the number of carbon atoms of the cycloalkyl group is from 3 to 20. According to another embodiment, the number of carbon atoms of the cycloalkyl group is from 3 to 6. Examples thereof may include a cyclohexyl group and the like, but are not limited thereto.

In the present specification, the cycloalkenyl group is not particularly limited, however, the number of carbon atoms is from 3 to 40. According to another embodiment, the number of carbon atoms of the cycloalkenyl group is from 3 to 20. Specific examples thereof may include a cyclohexenyl group and the like, but are not limited thereto.

In the present specification, the aryl group is not particularly limited, however, the number of carbon atoms may be from 6 to 40 or 6 to 20. The aryl group may be a monocyclic aryl group or a polycyclic aryl group. Examples of the aryl group may include a phenyl group and the like, but are not limited thereto.

In the present specification, the heterocyclic group is a heterocyclic group including one or more of N, O, P, S, Si and Se as a heteroatom, and although not particularly limited thereto, the number of carbon atoms is preferably from 1 to 60. According to one embodiment, the number of carbon atoms of the heterocyclic group is from 1 to 30.

In the present specification, descriptions on the heterocyclic group provided above may be applied to the heteroaryl group except for being aromatic.

In the present specification, the arylene group may be selected from among the examples of the aryl group described above except for being divalent.

In the present specification, the alkylene group may be selected from among the examples of the alkyl group described above except for being divalent.

In the present specification, the cycloalkylene group may be selected from among the examples of the cycloalkyl group described above except for being divalent.

In the present specification, the heteroarylene group may be selected from among the examples of the heteroaryl group described above except for being divalent.

In the present specification, the "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In the present specification, the ring formed by adjacent groups bonding to each other may be monocyclic or polycyclic, may be aliphatic, aromatic or a fused ring of aromatic and aliphatic, and may form a hydrocarbon ring or a heteroring.

The hydrocarbon ring may be selected from among the examples of the cycloalkyl group or the aryl group except for those that are not monovalent. The heteroring may be aliphatic, aromatic or a fused ring of aromatic and aliphatic, and may be selected from among the examples of the heterocyclic group except for those that are not monovalent.

In one embodiment of the present specification, the ink composition comprises a solvent comprising a solvent represented by the following Chemical Formula 1, a solvent represented by the following Chemical Formula 2, and a solvent represented by the following Chemical Formula 3; and a charge transferring material or a light emitting material.

[Chemical Formula 1]

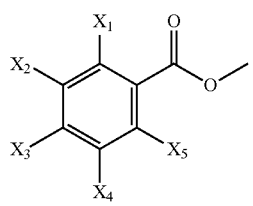

[Chemical Formula 2]

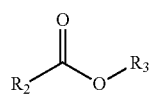

[Chemical Formula 3]

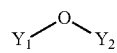

In Chemical Formulae 1 to 3, $X_1$ to $X_5$ are the same as or different from each other, and each independently hydrogen; deuterium; a substituted or unsubstituted alkyl group; a substituted or unsubstituted cycloalkyl group; a substituted or unsubstituted cycloalkenyl group; a substituted or unsubstituted alkoxy group; a substituted or unsubstituted ester group; or a substituted or unsubstituted aryl group, and at least one of $X_1$ to $X_5$ is a substituted or unsubstituted alkyl group; a substituted or unsubstituted ester group; or a substituted or unsubstituted alkoxy group, $R_1$ is a substituted or unsubstituted alkyl group; a substituted or unsubstituted cycloalkyl group; a substituted or unsubstituted cycloalkenyl group; or a substituted or unsubstituted aryl group, $R_2$ is a substituted or unsubstituted alkyl group; a substituted or unsubstituted cycloalkyl group; a substituted or unsubstituted cycloalkenyl group; or a substituted or unsubstituted aryl group, $R_3$ is a substituted or unsubstituted alkyl group; a substituted or unsubstituted cycloalkyl group; or a substituted or unsubstituted cycloalkenyl group, when $R_2$ is a substituted or unsubstituted aryl group, $R_3$ is a substituted or unsubstituted alkyl group having 4 to 15 carbon atoms, and $Y_1$ and $Y_2$ are the same as or different from each other, and each independently hydrogen; deuterium; a hydroxyl group; a carbonyl group; an ester group; a substituted or unsubstituted alkyl group; a substituted or unsubstituted alkenyl group; a substituted or unsubstituted cycloalkyl group; a substituted or unsubstituted cycloalkenyl group; a substituted or unsubstituted alkoxy group; or a substituted or unsubstituted aryl group.

In the present disclosure, the solvent represented by Chemical Formula 1 and the solvent represented by Chemical Formula 2 have favorable solubility for a functional layer material and have a low vapor pressure, and therefore, may secure ink stability by comprising the solvents. When forming the ink composition using a solvent comprising the solvent represented by Chemical Formula 1 and the solvent represented by Chemical Formula 2, an aggregation phenomenon does not occur due to high solubility of the solvent, and a film with a clean surface may be formed when forming a functional layer film.

Specifically, the solvent represented by Chemical Formula 1 may perform a role of increasing solubility of the charge transferring material or the light emitting material included in the ink composition. By the ink composition comprising the solvent represented by Chemical Formula 1, an excellent film image improving effect is obtained when forming a film using the ink composition.

When preparing a film using the ink composition, comprising the solvent represented by Chemical Formula 2 in the ink composition may perform a role of increasing flatness of the film center.

Meanwhile, the solvent represented by Chemical Formula 1 and the solvent represented by Chemical Formula 2 may have polarity excessively increased by comprising a functional group such as a carbonyl group or an ester group. However, the solvent represented by Chemical Formula 3 has relatively low polarity, and therefore, comprising the solvent represented by Chemical Formula 3 may prevent an excessive increase in the polarity of the ink composition compared to when comprising only the solvent represented by Chemical Formula 1 and the solvent represented by Chemical Formula 2. In addition, by having relatively low polarity, the solvent represented by Chemical Formula 3 lowers roughness of the film surface when forming a functional layer film due to a leveling effect. In other words, the solvent represented by Chemical Formula 3 may perform a role of flattening a shape of an ink edge portion formed on the bank wall. In addition thereto, the solvent represented by Chemical Formula 3 has a low vapor pressure, and therefore, may form a functional layer having an excellent film shape by controlling a solvent evaporation rate in an ink drying process.

In one embodiment of the present specification, $X_1$ to $X_5$ are the same as or different from each other, and each independently hydrogen; deuterium; a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; a substituted or unsubstituted alkoxy group having 1 to 20 carbon atoms; a substituted or unsubstituted ester group having 1 to 25 carbon atoms; or a substituted or unsubstituted aryl group having 6 to 40 carbon atoms, and at least one of $X_1$ to $X_5$ is a substituted or unsubstituted alkyl group having 1 to 20 carbon atoms; a substituted or unsubstituted ester group having 1 to 25 carbon atoms; or a substituted or unsubstituted alkoxy group having 1 to 20 carbon atoms.

In another embodiment, $X_1$ to $X_5$ are the same as or different from each other, and each independently hydrogen; deuterium; a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; a substituted or unsubstituted alkoxy group having 1 to 10 carbon atoms; a substituted or unsubstituted ester group having 6 to 25 carbon atoms; or a substituted or unsubstituted aryl group having 6 to 20 carbon atoms, and at least one of $X_1$ to $X_5$ is a substituted or unsubstituted alkyl group having 1 to 10 carbon atoms; a substituted or unsubstituted ester group having 6 to 25 carbon atoms; or a substituted or unsubstituted alkoxy group having 1 to 10 carbon atoms.

In another embodiment, $X_1$ to $X_5$ are the same as or different from each other, and each independently hydrogen; deuterium; a substituted or unsubstituted methyl group; a substituted or unsubstituted ethyl group; a substituted or unsubstituted methoxy group; a substituted or unsubstituted ethoxy group; or —OCO—R', R' is a substituted or unsubstituted alkyl group having 1 to 10 carbon atoms, and at least one of $X_1$ to $X_5$ is a substituted or unsubstituted methyl group; a substituted or unsubstituted ethyl group; a substituted or unsubstituted methoxy group; a substituted or unsubstituted ethoxy group; or —OCO—R', and R' is a substituted or unsubstituted alkyl group having 1 to 10 carbon atoms.

In another embodiment, $X_1$ to $X_5$ are the same as or different from each other, and each independently hydrogen; deuterium; a substituted or unsubstituted methyl group; a substituted or unsubstituted ethyl group; a substituted or unsubstituted methoxy group; a substituted or unsubstituted ethoxy group; or —OCO—R', R' is a substituted or unsubstituted methyl group; or a substituted or unsubstituted ethyl group, and at least one of $X_1$ to $X_5$ is a substituted or unsubstituted methyl group; a substituted or unsubstituted ethyl group; a substituted or unsubstituted methoxy group; a substituted or unsubstituted ethoxy group; or —OCO—R', and R' is a substituted or unsubstituted methyl group; or a substituted or unsubstituted ethyl group.

In another embodiment, $X_1$ to $X_5$ are the same as or different from each other, and each independently hydrogen;

deuterium; a methyl group; an ethyl group; a methoxy group; an ethoxy group; or —OCO—R', R' is a methyl group; or an ethyl group, and at least one of $X_1$ to $X_5$ is a methyl group; an ethyl group; a methoxy group; an ethoxy group; or —OCO—R', and R' is a methyl group; or an ethyl group.

In one embodiment of the present specification, $R_1$ is a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms.

In another embodiment, $R_1$ is a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; or a substituted or unsubstituted aryl group having 6 to 20 carbon atoms.

In another embodiment, $R_1$ may be a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted pentyl group; or a substituted or unsubstituted hexyl group.

In another embodiment, $R_1$ may be a methyl group; an ethyl group; a propyl group; an isopropyl group; a butyl group; a t-butyl group; a pentyl group; or a hexyl group.

In another embodiment, $R_1$ may be a methyl group; an ethyl group; or a butyl group.

In one embodiment of the present specification, Chemical Formula 1 may be any one of the following structures.

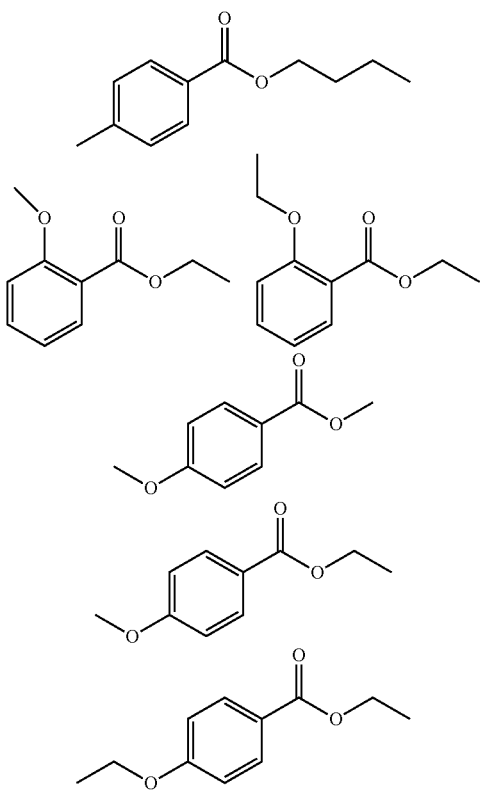

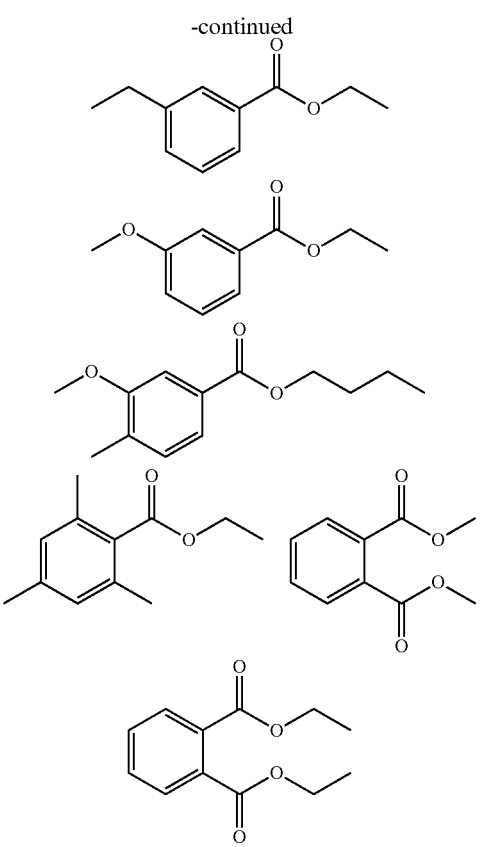

In one embodiment of the present specification, $R_2$ is a substituted or unsubstituted alkyl group having 1 to 20 carbon atoms; a substituted or unsubstituted cycloalkyl group having 3 to 40 carbon atoms; a substituted or unsubstituted cycloalkenyl group having 3 to 40 carbon atoms; or a substituted or unsubstituted aryl group having 6 to 40 carbon atoms.

In another embodiment, $R_2$ is a substituted or unsubstituted alkyl group having 1 to 10 carbon atoms; a substituted or unsubstituted cycloalkyl group having 3 to 20 carbon atoms; a substituted or unsubstituted cycloalkenyl group having 3 to 20 carbon atoms; or a substituted or unsubstituted aryl group having 6 to 20 carbon atoms.

In another embodiment, $R_2$ is a substituted or unsubstituted methyl group; a substituted or unsubstituted ethyl group; a substituted or unsubstituted propyl group; a substituted or unsubstituted isopropyl group; a substituted or unsubstituted butyl group; a substituted or unsubstituted t-butyl group; a substituted or unsubstituted pentyl group; a substituted or unsubstituted hexyl group; a substituted or unsubstituted heptyl group; a substituted or unsubstituted octyl group; a substituted or unsubstituted nonyl group; or a substituted or unsubstituted phenyl group.

In another embodiment, $R_2$ is a methyl group; an ethyl group; a propyl group; an isopropyl group; a butyl group; a t-butyl group; a pentyl group; a hexyl group; an n-heptyl group; an octyl group; an n-nonyl group; or a phenyl group.

In another embodiment, $R_2$ is an n-heptyl group; an n-nonyl group; or a phenyl group.

In one embodiment of the present specification, $R_3$ is a substituted or unsubstituted alkyl group having 1 to 20 carbon atoms; a substituted or unsubstituted cycloalkyl group having 3 to 40 carbon atoms; or a substituted or unsubstituted cycloalkenyl group having 3 to 40 carbon atoms.

In one embodiment of the present specification, $R_3$ is a substituted or unsubstituted alkyl group having 1 to 15 carbon atoms; a substituted or unsubstituted cycloalkyl group having 3 to 20 carbon atoms; or a substituted or unsubstituted cycloalkenyl group having 3 to 20 carbon atoms.

In one embodiment of the present specification, $R_3$ is a substituted or unsubstituted alkyl group having 1 to 15 carbon atoms.

In one embodiment of the present specification, $R_3$ is a substituted or unsubstituted alkyl group having 4 to 15 carbon atoms.

In one embodiment of the present specification, $R_3$ is a substituted or unsubstituted ethyl group; a substituted or unsubstituted linear or branched butyl group; a substituted or unsubstituted linear or branched pentyl group; a substituted or unsubstituted linear or branched hexyl group; a substituted or unsubstituted linear or branched heptyl group; a substituted or unsubstituted linear or branched octyl group; or a substituted or unsubstituted linear or branched nonyl group.

In one embodiment of the present specification, $R_3$ is a substituted or unsubstituted ethyl group; a substituted or unsubstituted linear or branched butyl group; a substituted or unsubstituted linear or branched pentyl group; or a substituted or unsubstituted linear or branched hexyl group.

In one embodiment of the present specification, $R_3$ is an ethyl group; a linear or branched butyl group; a linear or branched pentyl group; or a linear or branched hexyl group.

In one embodiment of the present specification, $R_3$ is an ethyl group; an n-butyl group; an n-pentyl group (n-amyl group); an isopentyl group (isoamyl group); or an n-hexyl group.

In one embodiment of the present specification, when $R_2$ is a substituted or unsubstituted aryl group, $R_3$ is a substituted or unsubstituted alkyl group having 4 to 15 carbon atoms.

In one embodiment of the present specification, when $R_2$ is a substituted or unsubstituted phenyl group, $R_3$ is a substituted or unsubstituted alkyl group having 4 to 15 carbon atoms.

In one embodiment of the present specification, when $R_2$ is a phenyl group, $R_3$ is a substituted or unsubstituted linear or branched butyl group; a substituted or unsubstituted linear or branched pentyl group; or a substituted or unsubstituted linear or branched hexyl group.

In one embodiment of the present specification, when $R_2$ is a phenyl group, $R_3$ is an n-butyl group; an n-pentyl group (n-amyl group); an isopentyl group (isoamyl group); or an n-hexyl group.

In one embodiment of the present specification, Chemical Formula 2 may be any one of the following structures.

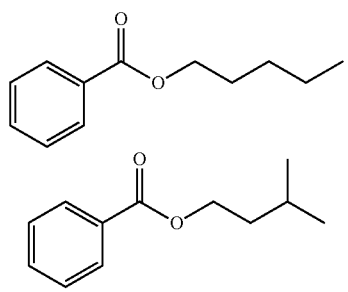

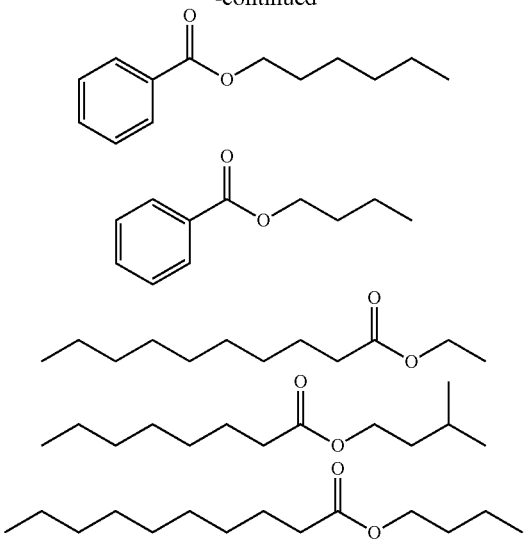

In one embodiment of the present specification, $Y_1$ and $Y_2$ are the same as or different from each other, and each independently hydrogen; deuterium; a hydroxyl group; a carbonyl group; an ester group; a substituted or unsubstituted alkyl group having 1 to 20 carbon atoms; a substituted or unsubstituted alkenyl group having 1 to 20 carbon atoms; a substituted or unsubstituted cycloalkyl group having 3 to 40 carbon atoms; a substituted or unsubstituted cycloalkenyl group having 3 to 40 carbon atoms; a substituted or unsubstituted alkoxy group having 1 to 20 carbon atoms; or a substituted or unsubstituted aryl group having 6 to 40 carbon atoms.

In one embodiment of the present specification, $Y_1$ and $Y_2$ are the same as or different from each other, and each independently hydrogen; deuterium; a hydroxyl group; a carbonyl group; an ester group; a substituted or unsubstituted alkyl group having 1 to 10 carbon atoms; a substituted or unsubstituted alkenyl group having 1 to 10 carbon atoms; a substituted or unsubstituted cycloalkyl group having 3 to 20 carbon atoms; a substituted or unsubstituted cycloalkenyl group having 3 to 20 carbon atoms; a substituted or unsubstituted alkoxy group having 1 to 10 carbon atoms; or a substituted or unsubstituted aryl group having 6 to 20 carbon atoms.

In one embodiment of the present specification, $Y_1$ and $Y_2$ are the same as or different from each other, and each independently hydrogen; a substituted or unsubstituted methyl group; a substituted or unsubstituted ethyl group; a substituted or unsubstituted butyl group; a substituted or unsubstituted pentyl group; a substituted or unsubstituted decyl group; a substituted or unsubstituted phenyl group; or a substituted or unsubstituted naphthyl group.

In one embodiment of the present specification, $Y_1$ and $Y_2$ are the same as or different from each other, and each independently hydrogen; a methyl group unsubstituted or substituted with a phenyl group; an ethyl group substituted with a hydroxyl group, methoxy group, an ethoxy group substituted with a methoxy group, a butoxy group, an ethoxy group substituted with a hydroxyl group, an ethoxy group substituted with a butoxy group, or an ethoxy group substituted with an ethoxy group substituted with a hydroxyl group; an n-butyl group; a phenyl group unsubstituted or substituted with a methyl group; a naphthyl group; or a 1,2,3,4-tetrahydronaphthyl group.

In one embodiment of the present specification, Chemical Formula 3 may be any one of the following structures.

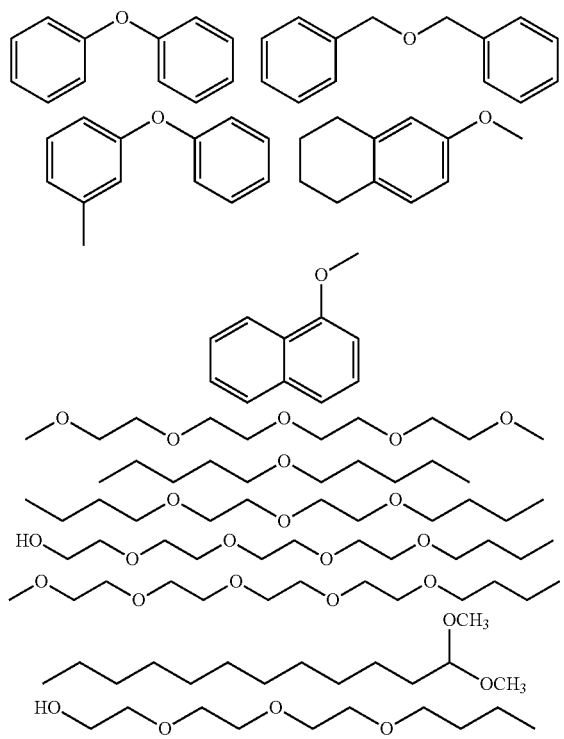

In another embodiment of the present specification, the solvent represented by Chemical Formula 3 may be triethylene glycol monobenzyl ether, tetraethylene glycol monomethyl ether, triethylene glycol n-butyl ether, tetraethylene glycol dimethyl ether, triethylene glycol butylmethyl ether, triethylene glycol monoisopropyl ether, diethylene glycol monohexyl ether, triethylene glycol monoethyl ether, diethylene glycol dibutyl ether, diethylene glycol monobutyl ether acetate, diethylene glycol, triethylene glycol monomethyl ether, diethylene glycol monoethyl ether acetate, dipropylene glycol propyl ether, diethylene glycol butylmethyl ether, diethylene glycol n-butyl ether, dipropylene glycol methyl ether, diethylene glycol monoethyl ether, dipropylene glycol n-butyl ether, dipropylene glycol methyl ether acetate, diethylene glycol divinyl ether, diethylene glycol monomethyl ether or triethylene glycol dimethyl ether.

In one embodiment of the present specification, the charge transferring material or the light emitting material is represented by the following Chemical Formula 4.

[Chemical Formula 4]

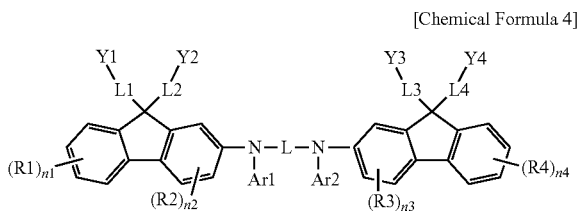

In Chemical Formula 4,

L1 to L4 are the same as or different from each other, and each independently a direct bond; a substituted or unsubstituted alkylene group; a substituted or unsubstituted cycloalkylene group; a substituted or unsubstituted arylene group; or a substituted or unsubstituted heteroarylene group, L is a substituted or unsubstituted arylene group; or a substituted or unsubstituted heteroarylene group, Ar1 and Ar2 are the same as or different from each other, and each independently a substituted or unsubstituted aryl group; or a substituted or unsubstituted heteroaryl group, R1 to R4 are the same as or different from each other, and each independently hydrogen; deuterium; a substituted or unsubstituted alkyl group; a substituted or unsubstituted alkoxy group; a substituted or unsubstituted aryl group; or a substituted or unsubstituted heteroaryl group, Y1 to Y4 are the same as or different from each other, and each independently hydrogen; a substituted or unsubstituted aryl group; or a photocuring group or a thermal curing group, and two or more of Y1 to Y4 are a photocuring group or a thermal curing group, n1 and n4 are each an integer of 0 to 4, n2 and n3 are each an integer of 0 to 3, and when n1 to n4 are each 2 or greater, substituents in the parentheses are the same as or different from each other.

By comprising a solvent comprising the solvent represented by Chemical Formula 1, the solvent represented by Chemical Formula 2 and the solvent represented by Chemical Formula 3; and the charge transferring material or the light emitting material represented by Chemical Formula 4, the ink composition of the present disclosure may secure ink stability, and form a flat film when manufacturing an organic light emitting device.

The solvent represented by Chemical Formula 1 and the solvent represented by Chemical Formula 2 of the present disclosure includes a polar functional group such as a carbonyl group or an ester group, and therefore, stability of the ink composition is high since solubility of the charge transferring material or the light emitting material is favorable. Particularly, the solvent represented by Chemical Formula 1 has high solubility and a low vapor pressure, and therefore, when drying the ink composition, an aggregation phenomenon does not occur, and a flat film may be formed when manufacturing an organic light emitting device.

Whereas the solvent represented by Chemical Formula 1 and the solvent represented by Chemical Formula 2 have a polar functional group, the solvent represented by Chemical Formula 3 has relatively low polarity, which may prevent ink composition polarity from becoming too high. By the ink composition of the present disclosure comprising the solvent represented by Chemical Formula 3, a part of the film formed during organic light emitting device manufacturing is prevented from being formed thick. In addition, the solvent represented by Chemical Formula 3 has a low vapor pressure, and controls an evaporation rate when drying the ink composition, and therefore, a film that has low surface roughness and is flat may be formed.

In one embodiment of the present specification, L1 to L4 are the same as or different from each other, and each independently a direct bond; a substituted or unsubstituted alkylene group having 1 to 20 carbon atoms; a substituted or unsubstituted cycloalkylene group having 3 to 30 carbon atoms; a substituted or unsubstituted arylene group having 6 to 30 carbon atoms; or a substituted or unsubstituted heteroarylene group having 2 to 30 carbon atoms.

In one embodiment of the present specification, L1 to L4 are the same as or different from each other, and each independently a direct bond; a substituted or unsubstituted alkylene group having 1 to 10 carbon atoms; a substituted or unsubstituted cycloalkylene group having 3 to 20 carbon atoms; a substituted or unsubstituted arylene group having 6 to 20 carbon atoms; or a substituted or unsubstituted heteroarylene group having 2 to 20 carbon atoms.

In one embodiment of the present specification, L1 to L4 are the same as or different from each other, and each independently a direct bond; a substituted or unsubstituted alkylene group having 1 to 10 carbon atoms; or a substituted or unsubstituted arylene group having 6 to 30 carbon atoms.

In one embodiment of the present specification, L1 to L4 are the same as or different from each other, and each independently a direct bond; a substituted or unsubstituted hexylene group; a substituted or unsubstituted heptylene group; or a substituted or unsubstituted phenylene group.

In one embodiment of the present specification, L1 to L4 are the same as or different from each other, and each independently a direct bond; a hexylene group; a heptylene group; or a phenylene group unsubstituted or substituted with a methyl group.

In one embodiment of the present specification, L1 is a direct bond; or a phenylene group.

In one embodiment of the present specification, L2 is a direct bond.

In one embodiment of the present specification, L2 is a hexylene group.

In one embodiment of the present specification, L2 is a heptylene group.

In one embodiment of the present specification, L2 is a phenylene group.

In one embodiment of the present specification, L2 is a phenylene group substituted with a methyl group.

In one embodiment of the present specification, L3 is a direct bond.

In one embodiment of the present specification, L3 is a hexylene group.

In one embodiment of the present specification, L3 is a heptylene group.

In one embodiment of the present specification, L3 is a phenylene group.

In one embodiment of the present specification, L4 is a direct bond; or a phenylene group.

In one embodiment of the present specification, L is a substituted or unsubstituted arylene group having 6 to 30 carbon atoms; or a substituted or unsubstituted heteroarylene group having 2 to 30 carbon atoms.

In one embodiment of the present specification, L is a substituted or unsubstituted arylene group having 6 to 20 carbon atoms; or a substituted or unsubstituted heteroarylene group having 2 to 20 carbon atoms.

In one embodiment of the present specification, L is a substituted or unsubstituted arylene group having 6 to 12 carbon atoms.

In one embodiment of the present specification, L is a substituted or unsubstituted biphenylene group.

In one embodiment of the present specification, L is a biphenylene group.

In one embodiment of the present specification, Ar1 and Ar2 are the same as or different from each other, and each independently a substituted or unsubstituted aryl group having to 30 carbon atoms; or a substituted or unsubstituted heteroaryl group having 6 to 30 carbon atoms.

In one embodiment of the present specification, Ar1 and Ar2 are the same as or different from each other, and each independently a substituted or unsubstituted aryl group having to 20 carbon atoms; or a substituted or unsubstituted heteroaryl group having 6 to 20 carbon atoms.

In one embodiment of the present specification, Ar1 and Ar2 are the same as or different from each other, and each independently a substituted or unsubstituted phenyl group; a substituted or unsubstituted biphenyl group; or a substituted or unsubstituted naphthyl group.

In one embodiment of the present specification, Ar1 and Ar2 are the same as or different from each other, and each independently a phenylene group; a biphenylene group; or a naphthyl group.

In one embodiment of the present specification, R1 to R4 are the same as or different from each other, and each independently hydrogen; deuterium; a substituted or unsubstituted alkyl group having 1 to 20 carbon atoms; a substituted or unsubstituted alkoxy group having 1 to 20 carbon atoms; a substituted or unsubstituted aryl group having 6 to 30 carbon atoms; or a substituted or unsubstituted heteroaryl group having 6 to 30 carbon atoms.

In one embodiment of the present specification, R1 to R4 are the same as or different from each other, and each independently hydrogen; deuterium; a substituted or unsubstituted alkyl group having 1 to 10 carbon atoms; a substituted or unsubstituted alkoxy group having 1 to 10 carbon atoms; a substituted or unsubstituted aryl group having 6 to 20 carbon atoms; or a substituted or unsubstituted heteroaryl group having 6 to 20 carbon atoms.

In one embodiment of the present specification, R1 to R4 are the same as or different from each other, and each independently hydrogen.

In one embodiment of the present specification, Y1 to Y4 are the same as or different from each other, and each independently hydrogen; a substituted or unsubstituted aryl group; or one of the following structures, and two or more of Y1 to Y4 are any one of the following structures.

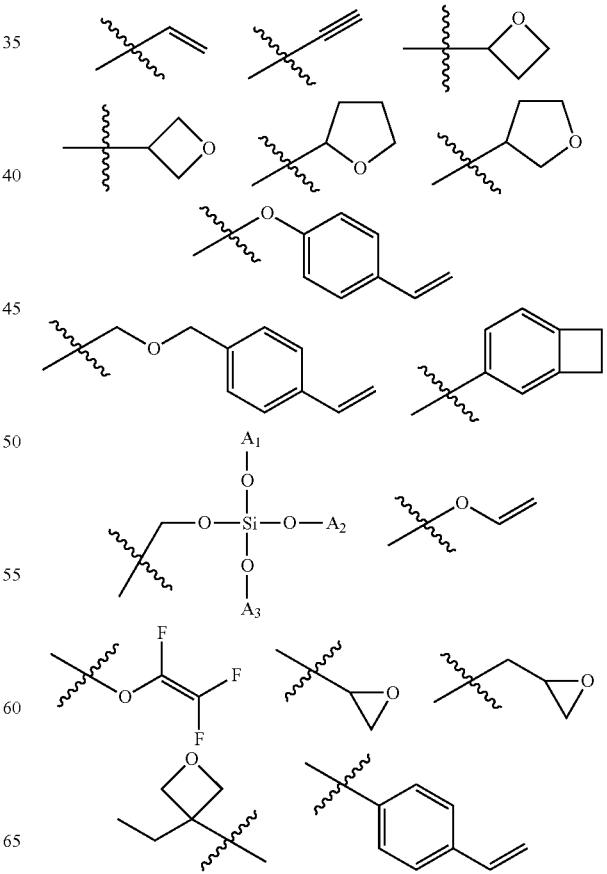

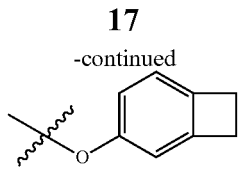

In the structures, A₁ to A₃ are the same as or different from each other, and each independently a substituted or unsubstituted alkyl group having 1 to 6 carbon atoms.

In one embodiment of the present specification, Y1 to Y4 are the same as or different from each other, and each independently hydrogen; a substituted or unsubstituted aryl group having 6 to 30 carbon atoms; or a photocuring group or a thermal curing group, and two or more of Y1 to Y4 are a photocuring group or a thermal curing group.

In one embodiment of the present specification, Y1 to Y4 are the same as or different from each other, and each independently hydrogen; a substituted or unsubstituted aryl group having 6 to 20 carbon atoms; or a photocuring group or a thermal curing group, and two or more of Y1 to Y4 are a photocuring group or a thermal curing group.

In one embodiment of the present specification, Y1 to Y4 are the same as or different from each other, and each independently hydrogen; a substituted or unsubstituted aryl group having 6 to 12 carbon atoms; or a photocuring group or a thermal curing group, and two or more of Y1 to Y4 are a photocuring group or a thermal curing group.

In one embodiment of the present specification, Y1 to Y4 are the same as or different from each other, and each independently hydrogen; a substituted or unsubstituted phenyl group; or a photocuring group or a thermal curing group, and two or more of Y1 to Y4 are a photocuring group or a thermal curing group.

In one embodiment of the present specification, the photocuring group or the thermal curing group in the definition of Y1 to Y4 is any one of the following structures.

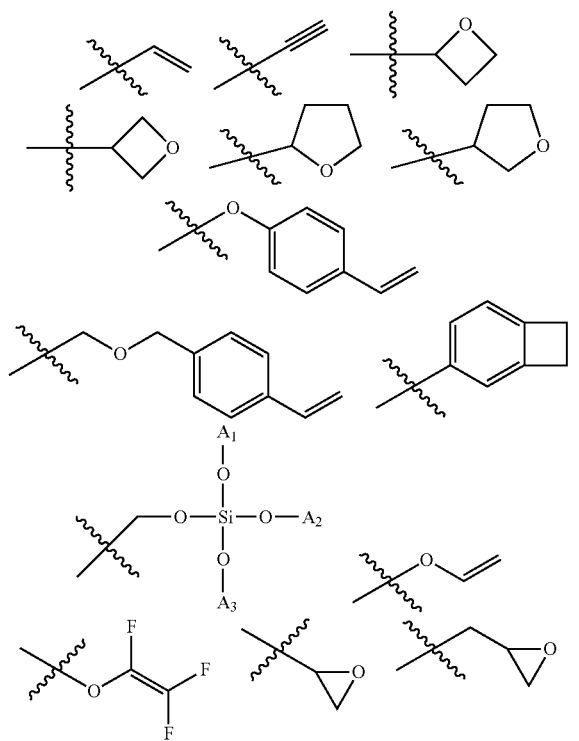

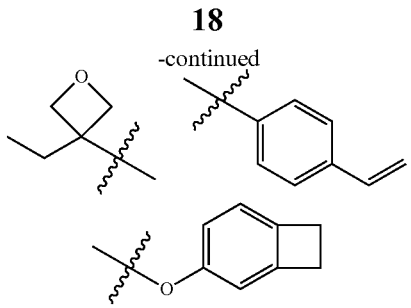

In the structures, A₁ to A₃ are the same as or different from each other, and each independently a substituted or unsubstituted alkyl group having 1 to 6 carbon atoms.

As in one embodiment of the present specification, a carbazole derivative including a photocuring group or a thermal curing group is economically effective in terms of time and costs since an organic light emitting device may be manufactured using a solution coating method.

In one embodiment of the present specification, the ink composition may further include a p-doping material.

The p-doping material means performing a role so that a compound has a p-semiconductor property. The p semiconductor property means a property receiving or transferring holes to a highest occupied molecular orbital (HOMO) energy level, that is, a property of a material having high hole conductivity.

The p-doping material may include an ionic compound represented by the following Chemical Formula 5 and/or a cationic compound represented by any one of the following Chemical Formulae 6 and 7.

In one embodiment of the present specification, the ink composition may further include an ionic compound represented by the following Chemical Formula 5.

[Chemical Formula 5]

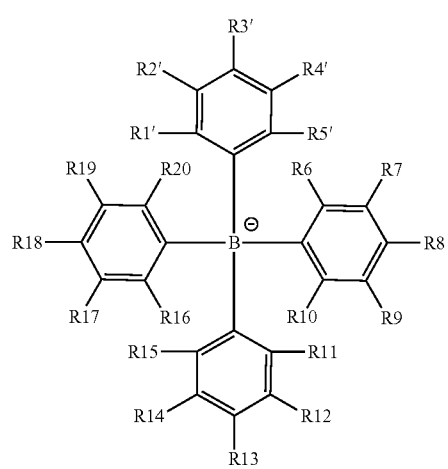

In Chemical Formula 5,

R1' to R5' and R6 to R20 are the same as or different from each other, and each independently hydrogen; deuterium; a halogen group; a nitro group; —C(O)R₁₀₀; —OR₁₀₁; —SR₁₀₂; —SO₃R₁₀₃; —COOR₁₀₄; —OC(O)R₁₀₅; —C(O)NR₁₀₆R₁₀₇; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted heterocyclic group, and $R_{100}$ to $R_{107}$ are the same as or different from each other, and each independently hydrogen; deuterium; or a substituted or unsubstituted alkyl group.

In one embodiment of the present specification, R1' to R5' and R6 to R20 are the same as or different from each other, and each independently hydrogen; a halogen group; a substituted or unsubstituted alkyl group; or a substituted or unsubstituted alkenyl group.

In one embodiment of the present specification, R1' to R5' and R6 to R20 are the same as or different from each other, and each independently hydrogen; a halogen group; a substituted or unsubstituted alkyl group having 1 to 30 carbon atoms; or a substituted or unsubstituted alkenyl group having 1 to 30 carbon atoms.

In one embodiment of the present specification, R1' to R5' and R6 to R20 are the same as or different from each other, and each independently hydrogen; a halogen group; a substituted or unsubstituted alkyl group having 1 to 20 carbon atoms; or a substituted or unsubstituted alkenyl group having 1 to 20 carbon atoms. In one embodiment of the present specification, R1' to R5' and R6 to R20 are the same as or different from each other, and each independently hydrogen; a halogen group; a substituted or unsubstituted alkyl group having 1 to 10 carbon atoms; or a substituted or unsubstituted alkenyl group having 1 to 10 carbon atoms.

In one embodiment of the present specification, R1' to R5' and R6 to R20 are the same as or different from each other, and each independently hydrogen; fluorine; or a substituted or unsubstituted vinyl group.

In one embodiment of the present specification, R1' to R5' and R6 to R20 are the same as or different from each other, and each independently hydrogen; fluorine; or a vinyl group unsubstituted or substituted with fluorine.

According to one embodiment of the present specification, Chemical Formula 5 may be any one of the following compounds.

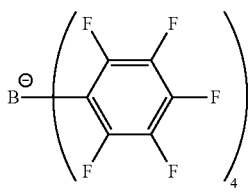

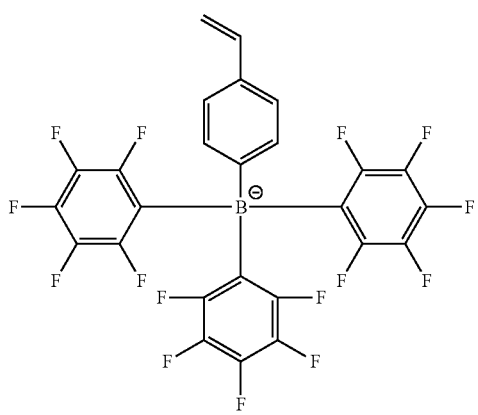

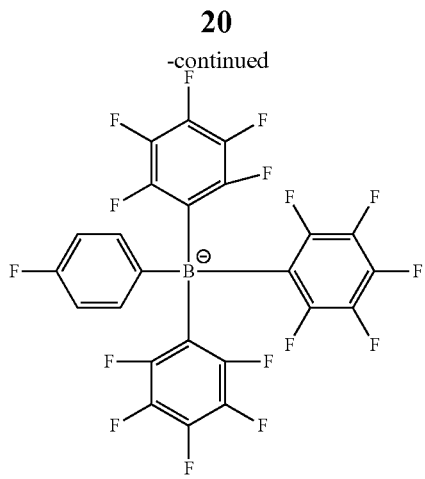

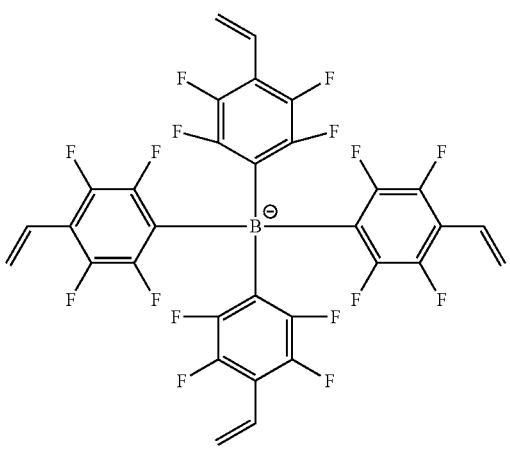

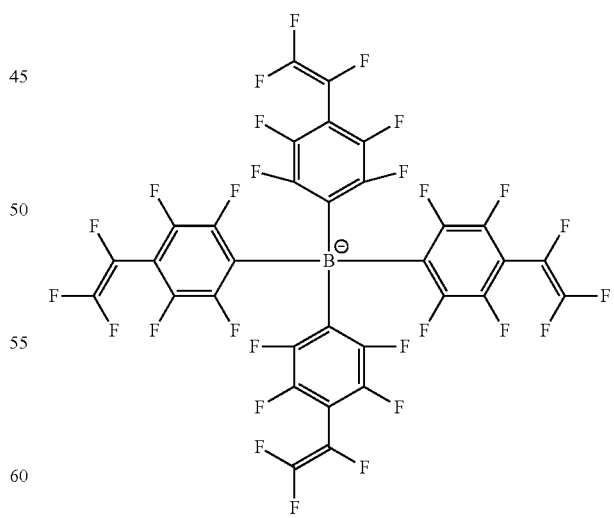

In one embodiment of the present specification, the ink composition further includes a cationic compound represented by any one of the following Chemical Formulae 6 and 7.

[Chemical Formula 6]

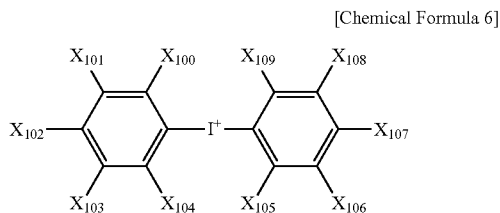

[Chemical Formula 7]

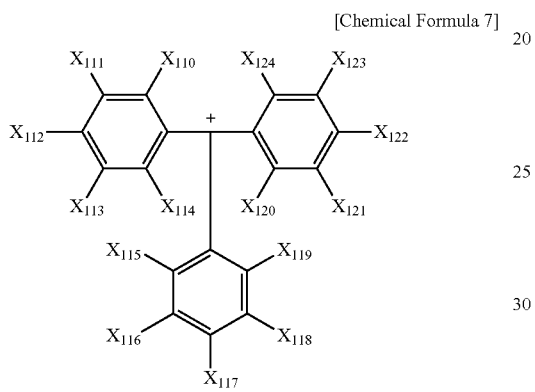

In Chemical Formulae 6 and 7, $X_{100}$ to $X_{124}$ are the same as or different from each other, and each independently hydrogen; a nitrile group; a nitro group; a hydroxyl group; a halogen group; a substituted or unsubstituted alkyl group; a substituted or unsubstituted alkenyl group; a substituted or unsubstituted alkoxy group; a substituted or unsubstituted aryloxy group; a substituted or unsubstituted amine group; a substituted or unsubstituted cycloalkyl group; or a substituted or unsubstituted aryl group.

In one embodiment of the present specification, $X_{100}$ to $X_{109}$ are the same as or different from each other, and each independently hydrogen; or a substituted or unsubstituted alkyl group.

In one embodiment of the present specification, $X_{100}$ to $X_{109}$ are the same as or different from each other, and each independently hydrogen; or a substituted or unsubstituted alkyl group having 1 to 30 carbon atoms.

In one embodiment of the present specification, $X_{100}$ to $X_{109}$ are the same as or different from each other, and each independently hydrogen; or a substituted or unsubstituted alkyl group having 1 to 20 carbon atoms.

In one embodiment of the present specification, $X_{100}$ to $X_{109}$ are the same as or different from each other, and each independently hydrogen; or a substituted or unsubstituted alkyl group having 1 to 10 carbon atoms.

In one embodiment of the present specification, $X_{100}$ to $X_{109}$ are the same as or different from each other, and each independently hydrogen; a substituted or unsubstituted methyl group; or a substituted or unsubstituted isopropyl group.

In one embodiment of the present specification, $X_{100}$ to $X_{109}$ are the same as or different from each other, and each independently hydrogen; a methyl group; or an isopropyl group.

In one embodiment of the present specification, $X_{100}$ to $X_{124}$ are the same as or different from each other, and each independently hydrogen; or a halogen group.

In one embodiment of the present specification, $X_{110}$ to $X_{124}$ are the same as or different from each other, and each independently hydrogen; or fluorine.

In one embodiment of the present specification, the cationic compound represented by any one of Chemical Formulae 6 and 7 may be any one of the following compounds.

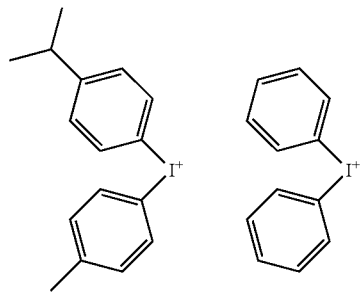

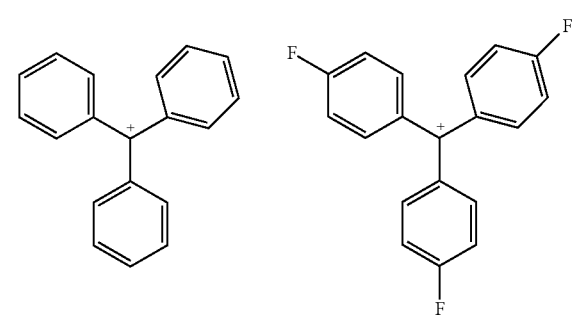

In one embodiment of the present specification, the p-doping material includes the compound represented by Chemical Formula 5 and the cationic compound represented by any one of Chemical Formulae 6 and 7, and may be any one of the following compounds, however, the p-doping material is not limited thereto.

Formula A

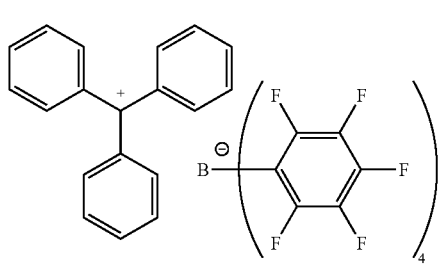

Formula B

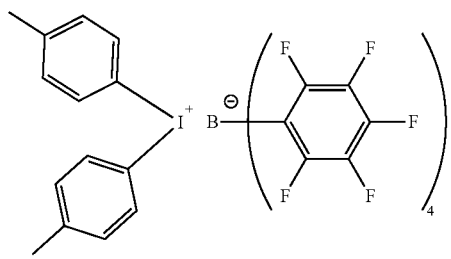

Formula C

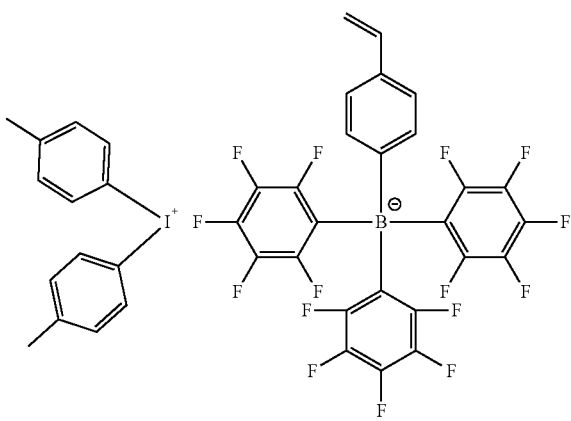

Formula D

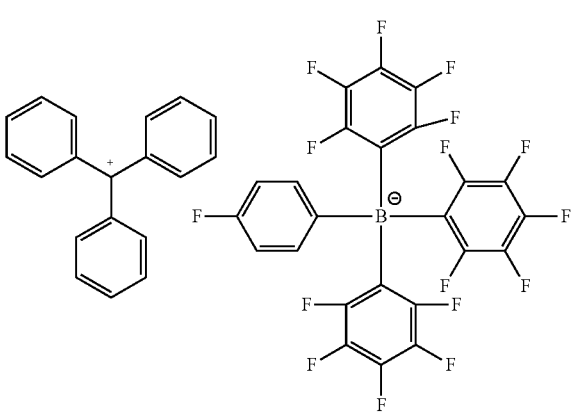

Formula E

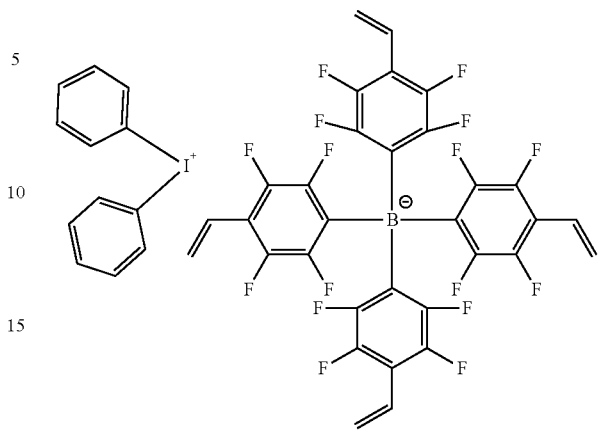

Formula F

In one embodiment of the present specification, the solvent represented by Chemical Formula 3 is included in less than 50 parts by weight with respect to 100 parts by weight of the solvent.

Specifically, the solvent represented by Chemical Formula 3 is included in greater than or equal to 10 parts by weight and less than or equal to 45 parts by weight with respect to 100 parts by weight of the solvent. More specifically, the solvent represented by Chemical Formula 3 is included in greater than or equal to 20 parts by weight and less than or equal to 43 parts by weight with respect to 100 parts by weight of the solvent.

The solvent represented by Chemical Formula 3 corresponding to the above-mentioned range may prevent the film center flatness from decreasing.

In one embodiment of the present specification, Chemical Formula 4 is represented by any one of the following Chemical Formulae 4-1 to 4-6.

Formula 4-1
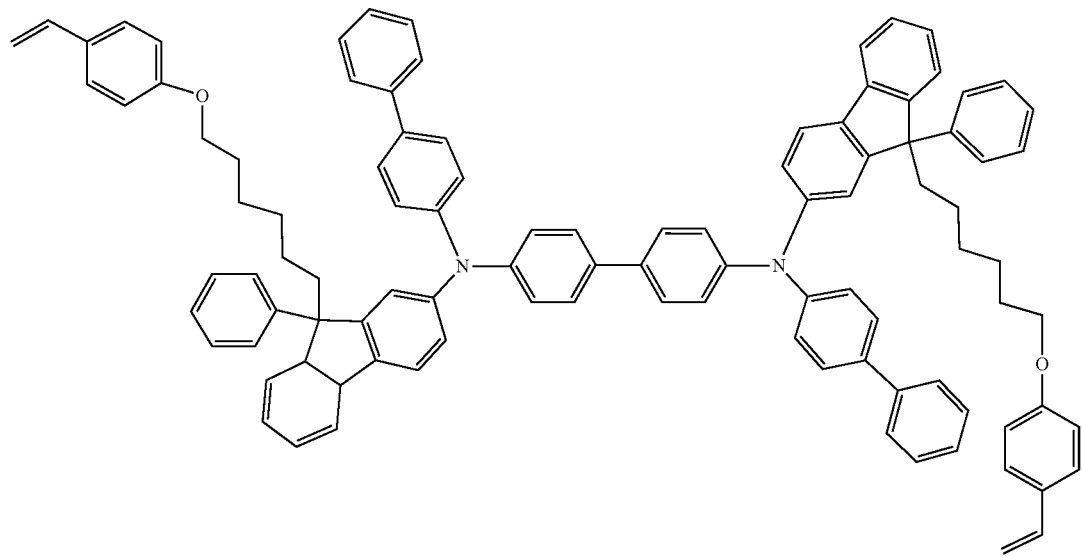
Formula 4-2
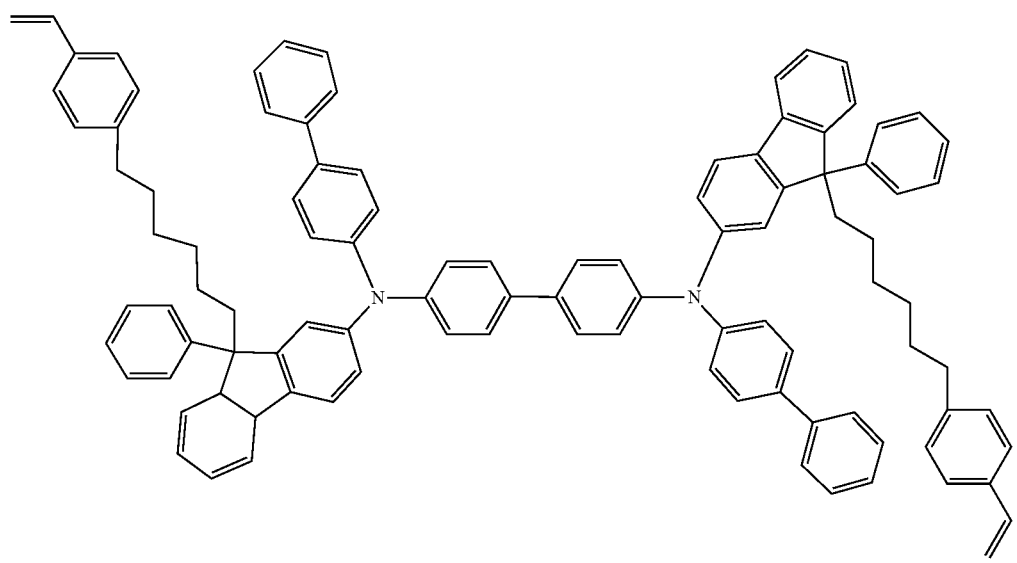
Formula 4-3
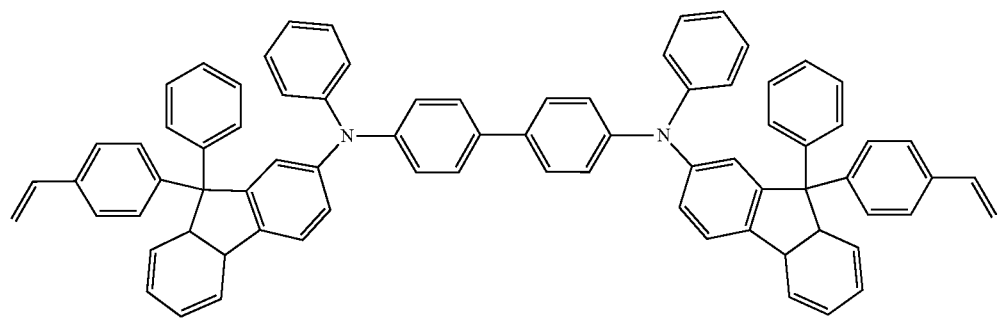

-continued

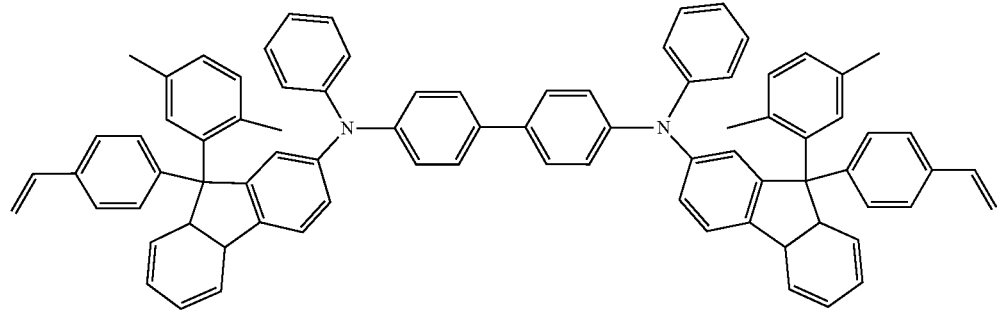

Formula 4-4

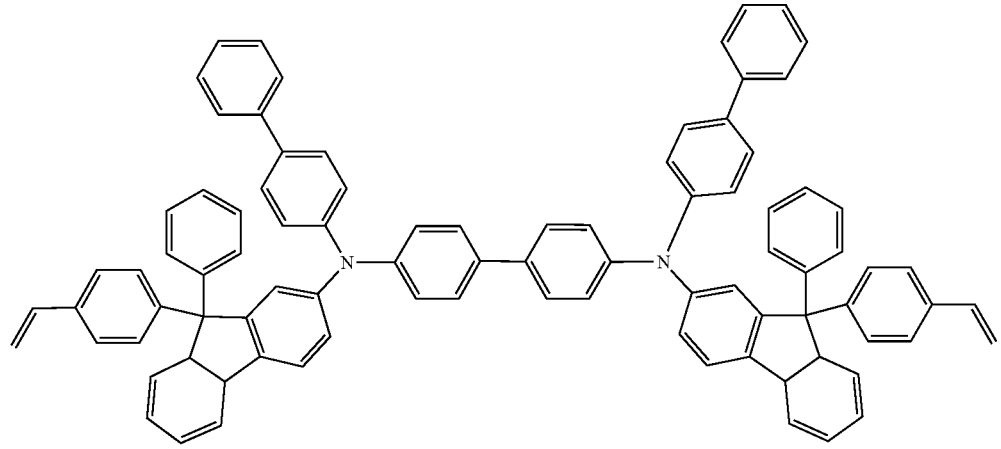

Formula 4-5

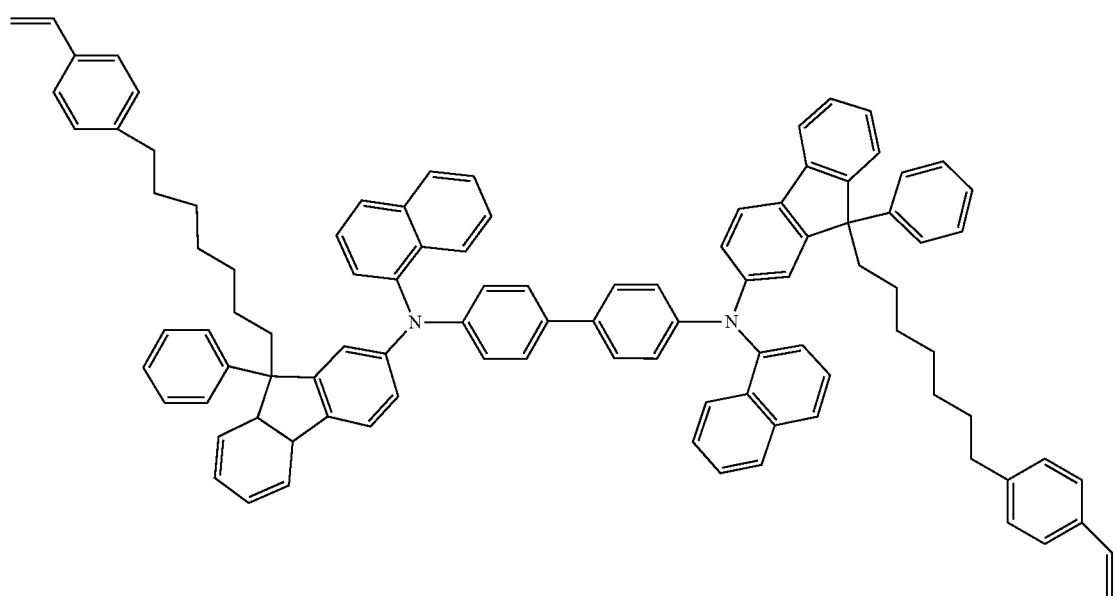

Formula 4-6

In one embodiment of the present specification, the charge transferring material or the light emitting material of the ink composition is included in 0.1 parts by weight to 10 parts by weight with respect to 100 parts by weight of the solvent. The charge transferring material or the light emitting material of the ink composition is preferably included in 1 parts by weight to 5 parts by weight with respect to 100 parts by weight of the solvent. When the charge transferring material or the light emitting material is included in the above-mentioned content range, a film with a target thickness is readily obtained by adjusting the number of drops. Particularly, there are advantages in that a film with a high thickness may be obtained, and a flat film may be formed after drying. In one embodiment of the present specification, the solvent represented by Chemical Formula 1 and the solvent represented by Chemical Formula 2 included in the ink composition have polarity and thereby have excellent solubility for a functional layer material, and therefore, stability of the ink composition may be secured. In addition, the solvent represented by Chemical Formula 3 has relatively low polarity, and may prevent flatness of the membrane from decreasing caused by an excessive increase in the polarity of the ink composition. Accordingly, the solvent represented by Chemical Formula 1, the solvent comprising the solvent represented by Chemical Formula 2 and the solvent represented by Chemical Formula 3 sufficiently dissolves a functional layer material, and when forming a film using the ink composition comprising the solvent, a flat and uniform film may be prepared.

In one embodiment of the present specification, solubility of the charge transferring material or the light emitting material is greater than or equal to 2 wt % and less than or equal to 15 wt % with respect to the total solvent weight at 25° C. and 1 atm.

In one embodiment of the present specification, the ink composition has viscosity of greater than or equal to 2 cP and less than or equal to 20 cP. More preferably, the viscosity is greater than or equal to 3 cP and less than or equal to 15 cP. Having the viscosity as in the above-mentioned range may have discharge stability, which is advantageous in device manufacturing. The viscosity may be a value measured at 25° C.

In one embodiment of the present specification, the ink composition may further comprise one or two types of compounds selected from the group consisting of a compound introducing a crosslinkable functional group into the molecule, and a polymer compound.

In one embodiment of the present specification, the ink composition may further comprise a compound introducing a crosslinkable functional group into the molecule. When the coating composition further comprises a compound introducing a crosslinkable functional group into the molecule, the coating composition may have increased hardness.

According to one embodiment of the present specification, the compound introducing a crosslinkable functional group into the molecule has a molecular weight of 100 g/mol to 3,000 g/mol. In another embodiment of the present specification, the compound introducing a crosslinkable functional group into the molecule more preferably has a molecular weight of 500 g/mol to 2,000 g/mol.

In one embodiment of the present specification, the ink composition may further comprise a polymer compound. When the ink composition further comprises a polymer compound, the ink composition may have increased ink properties. In other words, the ink composition further comprising the polymer compound may provide proper viscosity for coating or inkjet, and may form a flat film.

In one embodiment of the present specification, the polymer compound has a molecular weight of 10,000 g/mol to 200,000 g/mol.

In one embodiment of the present specification, the polymer compound may further comprise a photocuring group or a thermal curing group.

In one embodiment of the present specification, the ink composition may be a liquid phase. The "liquid phase" means in a liquid state at room temperature and atmospheric pressure.

According to one embodiment of the present specification, solvents other than the solvent comprising the solvent represented by Chemical Formula 1, the solvent represented by Chemical Formula 2 and the solvent represented by Chemical Formula 3 may be further comprised as a minor solvent when preparing the ink composition. Examples thereof may include solvents such as ether-based solvents such as phenoxytoluene or 3,4-dimethylanisole; ester-based solvents such as methyl benzoate or dimethyl phthalate; aromatic hydrocarbon-based solvents cyclohexylbenzene, methylnaphthalene, ethylnaphthalene, trimethylbenzene or mesitylene; aliphatic hydrocarbon-based solvents such as cyclohexane, methylcyclohexane, n-pentane, n-hexane, n-heptane, n-octane, n-nonane or n-decane; glycol ether-based solvents such as diethylene glycol butylmethyl ether or triethylene glycol monobenzyl ether; and fluorine-based solvents, however, the minor solvent is not limited thereto.

The minor solvent may be included in 0.1 wt % to 40 wt % and preferably in 1 wt % to 30 wt % with respect to the whole solvent.

In one embodiment of the present specification, the ink composition may further comprise one, two or more types of additives selected from the group consisting of thermal polymerization initiators and photopolymerization initiators.

Examples of the thermal polymerization initiator may include peroxides such as methyl ethyl ketone peroxide, methyl isobutyl ketone peroxide, acetylacetone peroxide, methylcyclohexanone peroxide, cyclohexanone peroxide, isobutyryl peroxide, 2,4-dichlorobenzoyl peroxide, bis-3,5, 5-trimethyl hexanoyl peroxide, lauryl peroxide, benzoyl peroxide, p-chlorobenzoyl peroxide, dicumyl peroxide, 2,5-dimethyl-2,5-(t-butyloxy)-hexane, 1,3-bis(t-butylperoxy-isopropyl)benzene, t-butyl cumyl peroxide, di-t-butyl peroxide, 2,5-dimethyl-2,5-(di-t-butylperoxy)hexane-3, tris-(t-butylperoxy)triazine, 1,1-di-t-butylperoxy-3,3,5-trimethylcyclohexane, 1,1-di-t-butylperoxycyclohexane, 2,2-di(t-butylperoxy)butane, 4,4-di-t-butylperoxy valeric acid n-butyl ester, 2,2-bis(4,4-t-butylperoxycyclohexyl)propane, t-butyl peroxyisobutyrate, di-t-butyl peroxyhexahydroterephthalate, t-butylperoxy-3,5,5-trimethylhexate, t-butyl peroxybenzoate or di-t-butyl peroxytrimethyl adipate; or azo-based such as azobis isobutylnitrile, azobis dimethylvaleronitrile or azobis cyclohexyl nitrile, but are not limited thereto.

Examples of the photopolymerization initiator may include acetophenone-based or ketal-based photopolymerization initiators such as diethoxyacetophenone, 2,2-dimethoxy-1,2-diphenyl ethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one or 1-phenyl-1,2-propanedion-2-(o-ethoxycarbonyl)oxime; benzoin ether-based photopolymerization initiators such as benzoin, benzoin methyl ether, benzoin ethyl ether, benzoin isobutyl ether or benzoin isopropyl ether; benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone or 1,4-benzoylbenzene; thioxanthone-based photopolymerization initiators such as 2-isopropylthioxanthone, 2-chlorothioxanthone, 2,4-dimethylthioxanthone, 2,4-diethylthioxanthone or 2,4-dichlorothioxanthone; and, as other photopolymerization initiators, ethyl anthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methylphenylglyoxyester, 9,10-phenanthrene, acridine-based compounds, triazine-based compounds, imidazole-based compounds, and the like. In addition, those having a photopolymerization facilitating effect may be used either alone or together with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

In one embodiment of the present specification, the ink composition may further comprise other additives such as a surfactant. The surfactant is preferably a nonionic surfactant, and may be a silicone-based or fluorine-based surfactant, but is not limited thereto.

In one embodiment of the present specification, the ink composition does not further comprise a p-doping material.

In another embodiment, the ink composition further comprises a p-doping material.

In the present specification, the p-doping material may also facilitate thermal curing or photocuring.

In the present specification, the p-doping material means a material enabling a host material to have a p semiconductor property. The p semiconductor property means a property receiving or transferring holes to a highest occupied molecular orbital (HOMO) energy level, that is, a property of a material having high hole conductivity.

The present specification also provides an organic light emitting device formed using the ink composition.

In one embodiment of the present specification, the organic light emitting device comprises a cathode; an anode provided opposite to the cathode; and one or more organic material layers provided between the cathode and the anode, wherein one or more layers of the organic material layers are formed using the ink composition.

In one embodiment of the present specification, the organic material layer formed using the ink composition is a hole transfer layer, a hole injection layer, or a layer carrying out hole transfer and hole injection at the same time.

In another embodiment, the organic material layer formed using the ink composition is a light emitting layer.

In one embodiment of the present specification, the organic light emitting device further comprises one, two or more layers selected from the group consisting of a hole injection layer, a hole transfer layer, an electron transfer layer, an electron injection layer, an electron blocking layer and a hole blocking layer.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

The organic material layer of the organic light emitting device of the present specification may be formed in a single layer structure, but may also be formed in a multilayer structure in which two or more organic material layers are laminated. For example, the organic light emitting device of the present disclosure may have a structure comprising a hole injection layer, a hole transfer layer, a light emitting layer, an electron transfer layer, an electron injection layer and the like as the organic material layer. However, the structure of the organic light emitting device is not limited thereto, and may comprise less numbers of organic material layers.

For example, a structure of the organic light emitting device according to one embodiment of the present specification is illustrated in FIG. 1.

FIG. 1 illustrates a structure of the organic light emitting device in which an anode (201), a hole injection layer (301), a hole transfer layer (401), a light emitting layer (501), an electron transfer layer (601) and a cathode (701) are consecutively laminated on a substrate (101).

In FIG. 1, the hole injection layer (301), the hole transfer layer (401) or the light emitting layer (501) is formed using the ink composition.

FIG. 1 illustrates the organic light emitting device, however, the organic light emitting device is not limited thereto.

When the organic light emitting device comprises a plurality of organic material layers, the organic material layers may be formed with materials that are the same as or different from each other.

The organic light emitting device of the present specification may be manufactured using materials and methods known in the art, except that one or more layers of the organic material layers are formed using the ink composition.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer comprising a hole injection layer, a hole transfer layer, a light emitting layer and an electron transfer layer thereon, and then depositing a material capable of being used as a cathode thereon. In addition to such a method, the organic light emitting device may also be manufactured by consecutively depositing a cathode material, an organic material layer and an anode material on a substrate.

The present specification also provides a method for manufacturing an organic light emitting device formed using the ink composition.

One embodiment of the present specification provides a method for manufacturing an organic light emitting device comprising preparing a substrate; forming a cathode or an anode on the substrate; forming one or more organic material layers on the cathode or the anode; and forming an anode or a cathode on the organic material layers, wherein the forming of the organic material layers comprise forming one or more organic material layers using the ink composition.

Specifically, the method for manufacturing an organic light emitting device in one embodiment of the present specification comprise preparing a substrate; forming a cathode or an anode on the substrate; forming one or more organic material layers on the cathode or the anode; and forming an anode or a cathode on the organic material layers, wherein one or more layers of the organic material layers are formed using the ink composition.

In one embodiment of the present specification, the organic material layer formed using the ink composition is formed using an inkjet printing method.

In one embodiment of the present specification, after the forming of one or more organic material layers using the ink composition, heat treating the organic material layer formed using the ink composition may be further included.

In one embodiment of the present specification, the time of the heat treating of the organic material layer formed using the ink composition is preferably within 1 hour and more preferably within 30 minutes.

In one embodiment of the present specification, the atmosphere of the heat treating of the organic material layer formed using the ink composition is preferably inert gas such as argon or nitrogen.

When comprising the heat treating or light treating in forming the organic material layer formed using the ink composition, an organic material layer comprising a thin-filmed structure by a plurality of photocuring groups or thermal curing groups included in the ink composition forming crosslinkage may be provided. In this case, being dissolved, morphologically affected or decomposed by the solvent deposited on the surface of the organic material layer formed using the ink composition may be prevented.

Accordingly, when the organic material layer formed using the ink composition is formed comprising the heat treating or light treating, resistance for the solvent increases, and a multilayer may be formed by repeatedly performing a solution depositing and crosslinking method, and device lifetime properties may be enhanced by increasing stability.

In one embodiment of the present specification, the ink composition may be dispersed by being mixed to a polymer binder.

In one embodiment of the present specification, as the polymer binder, those that do not extremely inhibit charge transfer and do not strongly absorb visible rays are preferably used. Examples of the polymer binder may include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, polysiloxane and the like.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzo quinoline-metal compounds; benzoxazole-, benzthiazole- and benzimidazole-based compounds; poly(p-phenylenevinylene) (PPV)-based polymers; spiro compounds; polyfluorene, rubrene, and the like, but are not limited thereto.

The light emitting layer may comprise a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

EXAMPLE

Types of solvents used in examples and comparative examples are shown in the following Table 1.

TABLE 1

| Solvent Type | Solvent Name | Boiling Point (° C.) | Abbreviation |
| --- | --- | --- | --- |
| Solvent represented by Chemical | Dimethyl phthalate | 298 | DMP |
| | Ethyl-4-methoxy benzoate | 263 | EMB |

TABLE 1-continued

| Solvent Type | Solvent Name | Boiling Point (° C.) | Abbreviation |
| --- | --- | --- | --- |
| Formula 1 | Ethyl-4-ethoxy benzoate | 275 | EEB |
| Solvent represented by Chemical Formula 2 | Ethyl decanoate | 242 | ED |
| | Butyl decanoate | 274 | BD |
| | Hexyl benzoate | 272 | HB |
| | Isoamyl benzoate | 261 | IAB |
| | Amyl benzoate | 260 | AB |
| | Butyl benzoate | 249 | BB |
| Solvent represented by Chemical Formula 3 | Dibenzyl ether | 297 | DBE |
| | 1-Methoxynaphthalene | 293 | MON |
| | 6-Methoxy-1,2,3,4-hydronaphthalene | 278 | 6MTN |
| | 3-Phenoxytoluene | 271 | 3PT |
| | Tetraethylene glycol dimethyl ether | 275 | TTEG DME |
| | Diethylene glycol dibutyl ether | 256 | DEG DBE |
| | Tetraethylene glycol-n-butyl ether | 278 | TTEG BE |
| | Trietylene glycol n-butyl ether | 278 | TEG BE |

Examples 1 to 12

The compound represented by Chemical Formula 4-1 and the compound represented by Chemical Formula C were dissolved in 3 parts by weight with respect to 100 parts by weight of the solvent. A weight ratio of the compound represented by Chemical Formula C to the compound represented by Chemical Formula 4-1 was 8:2, and ink compositions of Examples 1 to 12 were prepared using the solvents described in the following Table 2.

The content of each of the solvents represented by Chemical Formulae 1 to 3 included in the solvent was prepared as in the following three compositions based on 100 parts by weight of the solvent. Evaluation results depending on each of the compositions are described in the following Table 6.

1) 40 parts by weight of the solvent represented by Chemical Formula 1, 40 parts by weight of the solvent represented by Chemical Formula 2, and 20 parts by weight of the solvent represented by Chemical Formula 3

2) 30 parts by weight of the solvent represented by Chemical Formula 1, 40 parts by weight of the solvent represented by Chemical Formula 2, and 30 parts by weight of the solvent represented by Chemical Formula 3

3) 25 parts by weight of the solvent represented by Chemical Formula 1, 25 parts by weight of the solvent represented by Chemical Formula 2, and 50 parts by weight of the solvent represented by Chemical Formula 3

TABLE 2

| | Charge transfer material or light emitting material Chemical Formula | P-doping material Chemical Formula | Solvent represented by Chemical Formula 1 | Solvent represented by Chemical Formula 2 | Solvent representeted by Chemical Formula 3 |
|---|---|---|---|---|---|
| | Charge transfer material or light emitting material: p-doping material (8:2) | | Solvent | | |
| Example 1 | 4-1 | C | DMP | IAB | DBE |
| Example 2 | | | EEB | IAB | DBE |
| Example 3 | | | EEB | HB | DEGDBE |
| Example 4 | | | EEB | ED | 6MTN |
| Example 5 | | | EMB | AB | DEGDBE |
| Example 6 | | | EMB | IAB | DBE |
| Example 7 | | | EMB | HB | TTEGDME |
| Example 8 | | | EMB | BB | DBE |
| Example 9 | | | EMB | BD | 6MTN |
| Example 10 | | | EMB | HB | 1MON |
| Example 11 | | | EMB | IAB | DEGDBE |
| Example 12 | | | EMB | BB | 3PT |

Examples 13 to 24

Ink compositions of Examples 13 to 24 were prepared in the same composition as in Example 1 except that Chemical Formula 4-1 was changed to Chemical Formula 4-2 and Chemical Formula C was changed to Chemical Formula E. Evaluation results depending on each of the compositions are described in the following Table 7.

Examples 25 to 36

The compound represented by Chemical Formula 4-3 and the compound represented by Chemical Formula C were dissolved in 3 parts by weight with respect to 100 parts by weight of the solvent. A weight ratio of the compound represented by Chemical Formula C to the compound represented by Chemical Formula 4-3 was 8:2, and ink compositions of Examples 25 to 36 were prepared using the solvents described in the following Table 3.

The content of each of the solvents represented by Chemical Formulae 1 to 3 included in the solvent was prepared as in the following three compositions based on 100 parts by weight of the solvent. Evaluation results depending on each of the compositions are described in the following Table 8.

1) 40 parts by weight of the solvent represented by Chemical Formula 1, 40 parts by weight of the solvent represented by Chemical Formula 2, and 20 parts by weight of the solvent represented by Chemical Formula 3

2) 30 parts by weight of the solvent represented by Chemical Formula 1, 40 parts by weight of the solvent represented by Chemical Formula 2, and 30 parts by weight of the solvent represented by Chemical Formula 3

3) 25 parts by weight of the solvent represented by Chemical Formula 1, 25 parts by weight of the solvent represented by Chemical Formula 2, and 50 parts by weight of the solvent represented by Chemical Formula 3

TABLE 3

| | Charge transfer material or light emitting material Chemical Formula | P-doping material Chemical Formula | Solvent represented by Chemical Formula 1 | Solvent represented by Chemical Formula 2 | Solvent representeted by Chemical Formula 3 |
|---|---|---|---|---|---|
| | Charge transfer material or light emitting material: p-doping material (8:2) | | Solvent | | |
| Example 25 | 4-3 | C | DMP | IAB | DBE |
| Example 26 | | | EEB | IAB | DBE |
| Example 27 | | | EEB | HB | DEGDBE |
| Example 28 | | | EEB | ED | 6MTN |
| Example 29 | | | EMB | AB | DBE |
| Example 30 | | | EMB | IAB | DBE |
| Example 31 | | | EMB | HB | TEGBE |
| Example 32 | | | EMB | BB | DBE |
| Example 33 | | | EMB | BD | 6MTN |
| Example 34 | | | EMB | HB | 1MON |
| Example 35 | | | EMB | IAB | DEGDBE |
| Example 36 | | | EMB | BB | 3PT |

Examples 37 to 48

Ink compositions of Examples 37 to 48 were prepared in the same composition as in Example 25 except that Chemical Formula 4-3 was changed to Chemical Formula 4-4. Evaluation results depending on each of the compositions are described in the following Table 9.

Examples 49 to 60

The compound represented by Chemical Formula 4-5 and the compound represented by Chemical Formula E were dissolved in 3 parts by weight with respect to 100 parts by weight of the solvent. A weight ratio of the compound represented by Chemical Formula E to the compound represented by Chemical Formula 4-5 was 8:2, and ink compositions of Examples 49 to 60 were prepared using the solvents described in the following Table 4.

The content of each of the solvents represented by Chemical Formulae 1 to 3 included in the solvent was prepared as in the following three compositions based on 100 parts by weight of the solvent. Evaluation results depending on each of the compositions are described in the following Table 10.

1) 40 parts by weight of the solvent represented by Chemical Formula 1, 40 parts by weight of the solvent represented by Chemical Formula 2, and 20 parts by weight of the solvent represented by Chemical Formula 3

2) 30 parts by weight of the solvent represented by Chemical Formula 1, 40 parts by weight of the solvent represented by Chemical Formula 2, and 30 parts by weight of the solvent represented by Chemical Formula 3

3) 25 parts by weight of the solvent represented by Chemical Formula 1, 25 parts by weight of the solvent represented by Chemical Formula 2, and 50 parts by weight of the solvent represented by Chemical Formula 3

Examples 61 to 72

Ink compositions of Examples 61 to 72 were prepared in the same composition as in Example 49 except that Chemical Formula 4-5 was changed to Chemical Formula 4-6. Evaluation results depending on each of the compositions are described in the following Table 11.

Comparative Examples 1 to 12

As described in the following Table 5, a charge transferring material or a light emitting material and a p-doping material were dissolved in 3 parts by weight with respect to 100 parts by weight of the solvent. A weight ratio of the p-doping material with respect to the charge transferring material or the light emitting material was 8:2, and ink compositions of Comparative Examples 1 to 12 were prepared using each of the solvents described in the following Table 5.

The content of each of the solvents represented by Chemical Formulae 1 to 3 included in the solvent was prepared as in the following three compositions based on 100 parts by weight of the solvent. Evaluation results depending on each of the compositions are described in the following Table 12.

1) 25 parts by weight of the solvent represented by Chemical Formula 1, and 75 parts by weight of the solvent represented by Chemical Formula 2 or the solvent represented by Chemical Formula 3

2) 50 parts by weight of the solvent represented by Chemical Formula 1, and 50 parts by weight of the solvent represented by Chemical Formula 2 or the solvent represented by Chemical Formula 3

3) 80 parts by weight of the solvent represented by Chemical Formula 1, and 20 parts by weight of the solvent represented by Chemical Formula 2 or the solvent represented by Chemical Formula 3

TABLE 4

| | Charge transfer material or light emitting material: p-doping material (8:2) | | Solvent | | |
|---|---|---|---|---|---|
| | Charge transfer material or light emitting material Chemical Formula | P-doping material Chemical Formula | Solvent represented by Chemical Formula 1 | Solvent represented by Chemical Formula 2 | Solvent representeted by Chemical Formula 3 |
| Example 49 | 4-5 | E | DMP | IAB | DBE |
| Example 50 | | | EEB | IAB | DBE |
| Example 51 | | | EEB | HB | DEGDBE |
| Example 52 | | | EEB | ED | 6MTN |
| Example 53 | | | EMB | AB | DEGDBE |
| Example 54 | | | EMB | IAB | DBE |
| Example 55 | | | EMB | HB | TEGBE |
| Example 56 | | | EMB | BB | DBE |
| Example 57 | | | EMB | BD | 6MTN |
| Example 58 | | | EMB | HB | 1MON |
| Example 59 | | | EMB | IAB | DEGDBE |
| Example 60 | | | EMB | BB | 3PT |

TABLE 5

| | Charge transfer material or light emitting material: p-doping material (8:2) | | Solvent | | |
|---|---|---|---|---|---|
| | Charge transfer material or light emitting material Chemical Formula | P-doping material Chemical Formula | Solvent represented by Chemical Formula 1 | Solvent represented by Chemical Formula 2 | Solvent representeted by Chemical Formula 3 |
| Comparative Example 1 | 4-1 | C | DMP | IAB | — |
| Comparative Example 2 | | | EEB | IAB | — |
| Comparative Example 3 | 4-2 | E | EEB | HB | — |
| Comparative Example 4 | | | EEB | ED | — |
| Comparative Example 5 | 4-3 | C | EMB | AB | — |
| Comparative Example 6 | | | EMB | IAB | — |
| Comparative Example 7 | 4-4 | C | EMB | HB | — |
| Comparative Example 8 | | | EMB | BB | — |
| Comparative Example 9 | 4-5 | E | EMB | BD | — |
| Comparative Example 10 | | | EMB | — | 1MON |
| Comparative Example 11 | 4-6 | E | EMB | — | DEGDBE |
| Comparative Example 12 | | | — | BB | 3PT |

For the ink compositions prepared in Examples 1 to 72 and Comparative Examples 1 to 12, solubility, discharge stability and uniformity of the formed film were measured at 25° C. and 1 atm, and described in the following Tables 6 to 12. Specific evaluation criteria are as follows.

1) Evaluation on Solubility: dissolved in less than 0.5 wt %: X dissolved in greater than or equal to 0.5 wt % and less than 2.0 wt %: Δ dissolved in 2.0 wt % or greater: O

2) Evaluation on discharge stability: measured using Fujifilm, Dimatix DMP-2800 equipment, 10 μl cartridge (DMC-11610), and the following criteria were used in the evaluation.

stably discharged without liquid droplet wavering: O liquid droplet wavered or not discharged: X 3) Evaluation on film image: after jetting the ink on the ITO substrate, the result was dried and how well the film was formed was observed using an optical microscope, and the following criteria were used in the evaluation.

film was favorably formed: O

Materials were precipitated and pellets were formed, or film surface roughness was severe (compared to an image of an empty pixel, there were even a small amount of white spots or blue spots on the ink film surface): X Regarding the evaluation on the film image, FIG. 2 is a diagram showing that the film surface is uniformly well formed.

FIG. 3 is a diagram showing that materials are precipitated and pellets are formed, or film surface roughness is severe.

4) Evaluation on film uniformity: after jetting the ink on the ITO substrate, the result was dried and how well the film was formed was observed, the film thickness was measured using an optical profiler (OP), and the following criteria were used in evaluating the film center flatness and the edge shape.

(1) Evaluation on film center flatness flatness of less than 0.5: O flatness of 0.5 or greater: X The flatness was calculated using the following calculation formula.

$$\text{Flatness} = \frac{H\max - H\min}{H\text{center}} \quad \text{[Calculation Formula]}$$

In the calculation formula, Hmax means a maximum thickness of the ink filling inside the pixel, Hmin means a minimum thickness of the ink filling inside the pixel, and Hcenter means a thickness of the ink filling inside the pixel from the center of the pixel bottom surface. Specifically, when referring to FIG. 4, Hmax, Hmim and Hcenter are presented.

(2) Evaluation on edge shape

Shape in which the film rises of falls 300 nm or greater on the bank wall: X

Shape in which the film horizontally touches near 300 nm on the bank wall: O

Specifically, when referring to FIG. 5 regarding the evaluation on the edge shape, the shape as in (a) means a shape in which the film horizontally touches near 300 nm on the bank wall, the shape as in (b) means a shape in which the film falls 300 nm or greater on the bank wall, and the shape as in c) means a shape in which the film rises 300 nm or greater on the bank wall.

TABLE 6

| Solvent represented by Chemical Formula 1 parts by weight : Solvent represented by Chemical Formula 2 parts by weight : Solvent represented by Chemical Formula 3 parts by weight | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 1 | O/O | O/O | O/O | O | O | O | O | O | O | O | O | O |
| Example 2 | O/O | O/O | O/O | O | O | O | O | O | O | O | O | O |
| Example 3 | O/O | O/O | O/O | O | O | O | O | O | O | O | O | O |
| Example 4 | O/O | O/O | O/O | O | O | O | O | O | x | O | O | O |
| Example 5 | O/O | O/O | O/O | O | O | O | O | O | O | O | O | O |
| Example 6 | O/O | O/O | O/O | O | O | O | O | O | O | O | O | O |
| Example 7 | O/O | O/O | O/O | O | O | O | O | O | O | O | O | O |
| Example 8 | O/O | O/O | O/O | O | O | O | O | O | O | O | O | O |
| Example 9 | O/O | O/O | O/O | O | O | O | O | O | x | O | O | O |
| Example 10 | O/O | O/O | O/O | O | O | O | O | O | x | O | O | O |
| Example 11 | O/O | O/O | O/O | O | O | O | O | O | O | O | O | O |
| Example 12 | O/O | O/O | O/O | O | O | O | O | O | x | O | O | O |

TABLE 7

| Solvent represented by Chemical Formula 1 parts by weight : Solvent represented by Chemical Formula 2 parts by weight : Solvent represented by Chemical Formula 3 parts by weight | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 13 | O/O | O/O | O/O | O | O | O | O | O | O | O | O | O |
| Example 14 | O/O | O/O | O/O | O | O | O | O | O | O | O | O | O |
| Example 15 | O/O | O/O | O/O | O | O | O | O | O | O | O | O | O |
| Example 16 | O/O | O/O | O/O | O | O | O | O | O | x | O | O | O |
| Example 17 | O/O | O/O | O/O | O | O | O | O | O | O | O | O | O |
| Example 18 | O/O | O/O | O/O | O | O | O | O | O | O | O | O | O |
| Example 19 | O/O | O/O | O/O | O | O | O | O | O | O | O | O | O |
| Example 20 | O/O | O/O | O/O | O | O | O | O | O | O | O | O | O |
| Example 21 | O/O | O/O | O/O | O | O | O | O | O | x | O | O | O |
| Example 22 | O/O | O/O | O/O | O | O | O | O | O | x | O | O | O |
| Example 23 | O/O | O/O | O/O | O | O | O | O | O | O | O | O | O |
| Example 24 | O/O | O/O | O/O | O | O | O | O | O | x | O | O | O |

TABLE 8

| Solvent represented by Chemical Formula 1 parts by weight : Solvent represented by Chemical Formula 2 parts by weight : Solvent represented by Chemical Formula 3 parts by weight | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 25 | O/O | O/O | O/O | O | O | O | O | O | O | O | O | O |
| Example 26 | O/O | O/O | O/O | O | O | O | O | O | O | O | O | O |
| Example 27 | O/O | O/O | O/O | O | O | x | O | O | O | O | O | O |
| Example 28 | O/O | O/O | O/O | O | O | O | O | O | x | O | O | O |
| Example 29 | O/O | O/O | O/O | O | O | O | O | O | O | O | O | O |
| Example 30 | O/O | O/O | O/O | O | O | O | O | O | O | O | O | O |
| Example 31 | O/O | O/O | O/O | O | O | x | O | O | O | O | O | O |
| Example 32 | O/O | O/O | O/O | O | O | O | O | O | O | O | O | O |
| Example 33 | O/O | O/O | O/O | O | O | O | O | O | x | O | O | O |
| Example 34 | O/O | O/O | O/O | O | O | O | O | O | x | O | O | O |
| Example 35 | O/O | O/O | O/O | O | O | x | O | O | O | O | O | O |
| Example 36 | O/O | O/O | O/O | O | O | O | O | O | x | O | O | O |

TABLE 9

| Solvent represented by Chemical Formula 1 parts by weight : Solvent represented by Chemical Formula 2 parts by weight : Solvent represented by Chemical Formula 3 parts by weight | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 37 | O/O | O/O | O/O | O | O | O | O | O | O | O | O | O |
| Example 38 | O/O | O/O | O/O | O | O | O | O | O | O | O | O | O |
| Example 39 | O/O | O/O | O/O | O | O | O | O | O | O | O | O | O |
| Example 40 | O/O | O/O | O/O | O | O | O | O | O | x | O | O | O |
| Example 41 | O/O | O/O | O/O | O | O | O | O | O | O | O | O | O |
| Example 42 | O/O | O/O | O/O | O | O | O | O | O | O | O | O | O |
| Example 43 | O/O | O/O | O/O | O | O | x | O | O | O | O | O | O |
| Example 44 | O/O | O/O | O/O | O | O | O | O | O | O | O | O | O |
| Example 45 | O/O | O/O | O/O | O | O | O | O | O | x | O | O | O |
| Example 46 | O/O | O/O | O/O | O | O | O | O | O | x | O | O | O |
| Example 47 | O/O | O/O | O/O | O | O | x | O | O | O | O | O | O |
| Example 48 | O/O | O/O | O/O | O | O | O | O | O | x | O | O | O |

TABLE 10

| | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| Solvent represented by Chemical Formula 1 parts by weight:Solvent represented by Chemical Formula 2 parts by weight:Solvent represented by Chemical Formula 3 parts by weight | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 49 | o/o | o/o | o/o | o | o | o | o | o | o | o | o | o |
| Example 50 | o/o | o/o | o/o | o | o | o | o | o | o | o | o | o |
| Example 51 | o/o | o/o | o/o | o | o | o | o | o | o | o | o | o |
| Example 52 | o/o | o/o | o/o | o | o | o | o | o | × | o | o | o |
| Example 53 | o/o | o/o | o/o | o | o | × | o | o | o | o | o | o |
| Example 54 | o/o | o/o | o/o | o | o | o | o | o | o | o | o | o |
| Example 55 | o/o | o/o | o/o | o | o | × | o | o | o | o | o | o |
| Example 56 | o/o | o/o | o/o | o | o | o | o | o | o | o | o | o |
| Example 57 | o/o | o/o | o/o | o | o | o | o | o | × | o | o | o |
| Example 58 | o/o | o/o | o/o | o | o | o | o | o | × | o | o | o |
| Example 59 | o/o | o/o | o/o | o | o | × | o | o | o | o | o | o |
| Example 60 | o/o | o/o | o/o | o | o | o | o | o | × | o | o | o |

TABLE 11

| | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| Solvent represented by Chemical Formula 1 parts by weight:Solvent represented by Chemical Formula 2 parts by weight:Solvent represented by Chemical Formula 3 parts by weight | 40:40:20 | 30:40:30 | 25:25:50 | 40:40:20 | 30:40:30 | 25:25:50 | 40:40:20 | 30:40:30 | 25:25:50 | 40:40:20 | 30:40:30 | 25:25:50 |
| Example 61 | o/o | o/o | o/o | o | o | o | o | o | o | o | o | o |
| Example 62 | o/o | o/o | o/o | o | o | o | o | o | o | o | o | o |
| Example 63 | o/o | o/o | o/o | o | o | o | o | o | o | o | o | o |
| Example 64 | o/o | o/o | o/o | o | o | o | o | o | × | o | o | o |
| Example 65 | o/o | o/o | o/o | o | o | o | o | o | o | o | o | o |
| Example 66 | o/o | o/o | o/o | o | o | o | o | o | o | o | o | o |
| Example 67 | o/o | o/o | o/o | o | o | o | o | o | o | o | o | o |
| Example 68 | o/o | o/o | o/o | o | o | o | o | o | o | o | o | o |
| Example 69 | o/o | o/o | o/o | o | o | o | o | o | o | o | × | o |
| Example 70 | o/o | o/o | o/o | o | o | o | o | o | o | o | × | o |
| Example 71 | o/o | o/o | o/o | o | o | o | o | o | o | o | o | o |
| Example 72 | o/o | o/o | o/o | o | o | o | o | o | × | o | o | o |

TABLE 12

| | Solubility/Discharge Stability | | | Evaluation on Film Image | | | Evaluation on Profile | | | | | |
|---|---|---|---|---|---|---|---|---|---|---|---|---|
| | | | | | | | Center Film Flatness | | | Edge Shape | | |
| Solvent represented by Chemical Formula 1 parts by weight:Solvent represented by Chemical Formula 2 or 3 | 25:75 | 50:50 | 80:20 | 25:75 | 50:50 | 80:20 | 25:75 | 50:50 | 80:20 | 25:75 | 50:50 | 80:20 |
| Comparative Example 1 | o/o | o/o | o/o | o | o | o | o | o | × | × | × | × |
| Comparative Example 2 | o/o | o/o | o/o | o | o | o | o | o | × | × | × | × |
| Comparative Example 3 | o/o | o/o | o/o | o | o | o | o | o | × | × | × | × |
| Comparative Example 4 | o/× | o/× | o/o | × | o | o | o | o | × | × | × | × |
| Comparative Example 5 | o/o | o/o | o/o | o | o | o | o | o | × | × | × | × |
| Comparative Example 6 | o/o | o/o | o/o | o | o | o | o | o | × | × | × | × |
| Comparative Example 7 | o/o | o/o | o/o | o | o | o | o | o | × | × | × | × |
| Comparative Example 8 | o/o | o/o | o/o | o | o | o | o | o | × | × | × | × |
| Comparative Example 9 | o/× | o/o | o/o | × | o | o | o | o | × | × | × | × |
| Comparative Example 10 | o/o | o/o | o/o | o | o | o | × | × | × | o | o | o |
| Comparative Example 11 | o/o | o/o | o/o | × | o | o | o | × | × | o | o | o |
| Comparative Example 12 | o/o | o/o | o/o | o | o | o | × | × | × | o | o | o |

From Tables 6 to 12, it was identified that the ink compositions prepared in Examples 1 to 72 had excellent evaluation results on the solubility, the discharge stability, and the edge shape in the film uniformity evaluation compared to the ink compositions prepared in Comparative Examples 1 to 12, and also had excellent results in the film image evaluation and/or the center film flatness in the film uniformity evaluation.

REFERENCE NUMERAL

101: Substrate

201: Anode

301: Hole Injection Layer

401: Hole Transfer Layer

501: Light Emitting Layer

601: Electron Transfer Layer

701: Cathode (a): shape in which the film horizontally touches near 300 nm on the bank wall (b): shape in which the film falls 300 nm or greater on the bank wall (c): shape in which the film rises 300 nm or greater on the bank wall

The invention claimed is:

1. An ink composition comprising:
a solvent comprising a first solvent selected from group 1, a second solvent selected from group 2, and a third solvent selected from group 3; and
a charge transferring material or a light emitting material:

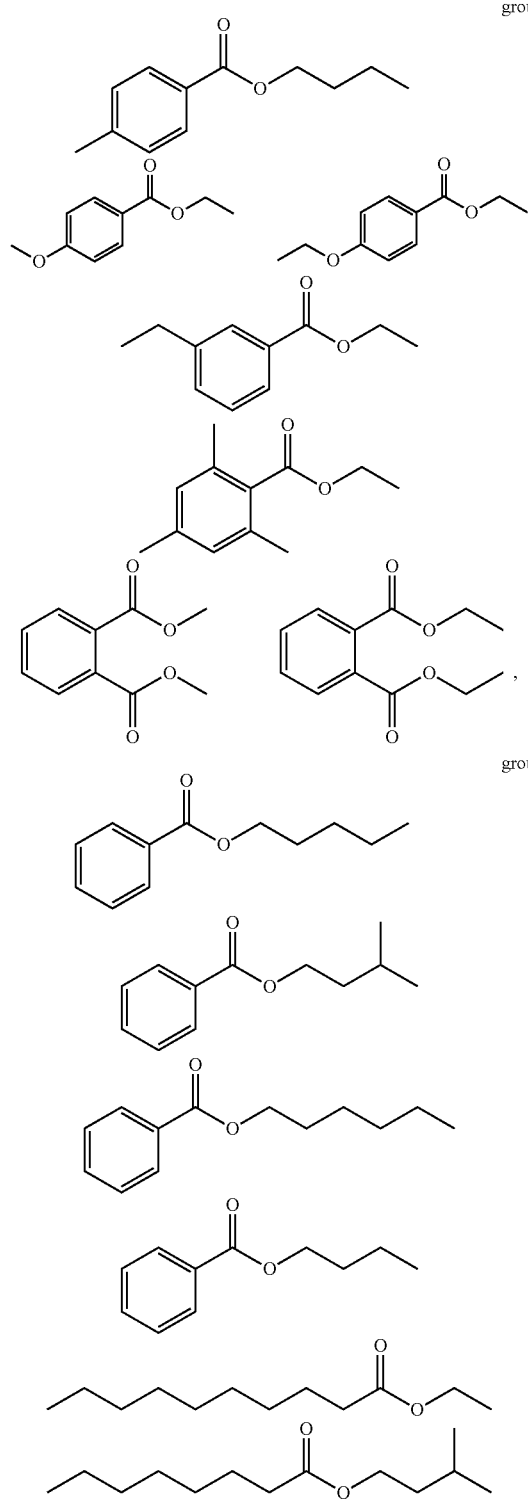

group 1 group 2

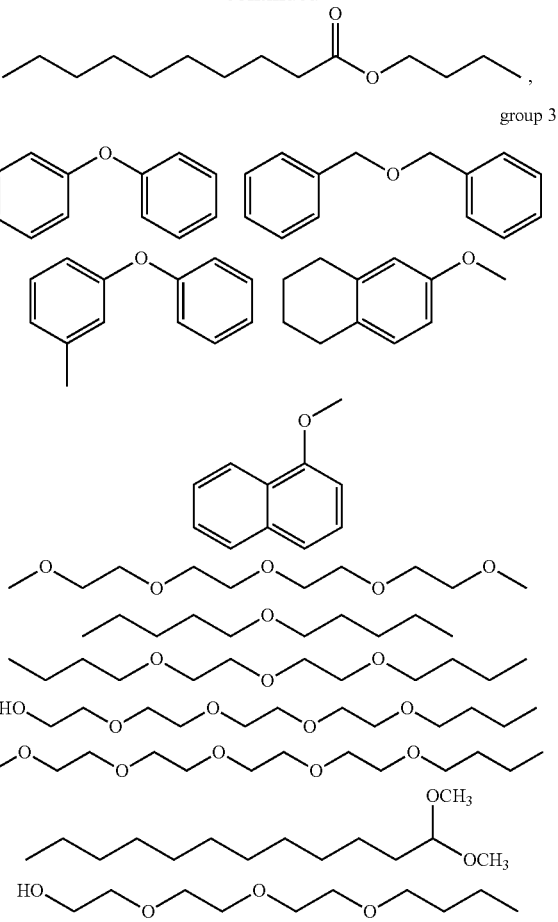

group 3 triethylene glycol monobenzyl ether, tetraethylene glycol monomethyl ether, triethylene glycol butyl methyl ether, triethylene glycol monoisopropyl ether, diethylene glycol monohexyl ether, triethylene glycol monoethyl ether, diethylene glycol monobutyl ether acetate, diethylene glycol, triethylene glycol monomethyl ether, diethylene glycol monoethyl ether acetate, dipropylene glycol propyl ether, diethylene glycol butyl methyl ether, diethylene glycol n-butyl ether, dipropylene glycol methyl ether, diethylene glycol monoethyl ether, dipropylene glycol n-butyl ether, dipropylene glycol methyl ether acetate, diethylene glycol divinyl ether, diethylene glycol monomethyl ether or triethylene glycol dimethyl ether.

2. The ink composition of claim 1, wherein solubility of the charge transferring material or the light emitting material for the solvent is from 2 wt % to 15 wt % at 25° C. and 1 atm.

3. The ink composition of claim 1, wherein the charge transferring material or the light emitting material is included in 0.1 parts by weight to 10 parts by weight with respect to 100 parts by weight of the solvent.

4. The ink composition of claim 1, which has viscosity of greater than or equal to 2 cP and less than or equal to 20 cP.

5. The ink composition of claim 1, wherein the charge transferring material or the light emitting material is represented by the following Chemical Formula 4:

[Chemical Formula 4]

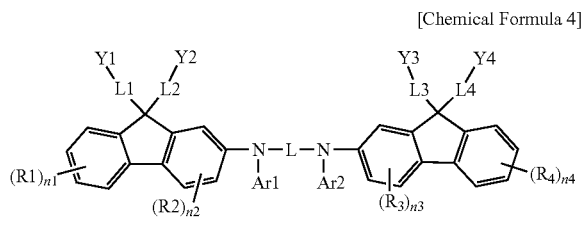

in Chemical Formula 4,

L1 to L4 are the same as or different from each other, and each independently a direct bond; a substituted or unsubstituted alkylene group; a substituted or unsubstituted cycloalkylene group; a substituted or unsubstituted arylene group; or a substituted or unsubstituted heteroarylene group;

L is a substituted or unsubstituted arylene group; or a substituted or unsubstituted heteroarylene group;

Ar1 and Ar2 are the same as or different from each other, and each independently a substituted or unsubstituted aryl group; or a substituted or unsubstituted heteroaryl group;

R1 to R4 are the same as or different from each other, and each independently hydrogen; deuterium; a substituted or unsubstituted alkyl group; a substituted or unsubstituted alkoxy group; a substituted or unsubstituted aryl group; or a substituted or unsubstituted heteroaryl group;

Y1 to Y4 are the same as or different from each other, and each independently hydrogen; a substituted or unsubstituted aryl group; or a photocuring group or a thermal curing group, and two or more of Y1 to Y4 are a photocuring group or a thermal curing group;

n1 and n4 are each an integer of 0 to 4;

n2 and n3 are each an integer of 0 to 3; and when n1 to n4 are each 2 or greater, R1s, R2s, R3s and R4s are the same as or different from each other.

6. The ink composition of claim 5, wherein the photocuring group or the thermal curing group in the definition of Y1 to Y4 is any one of the following structures:

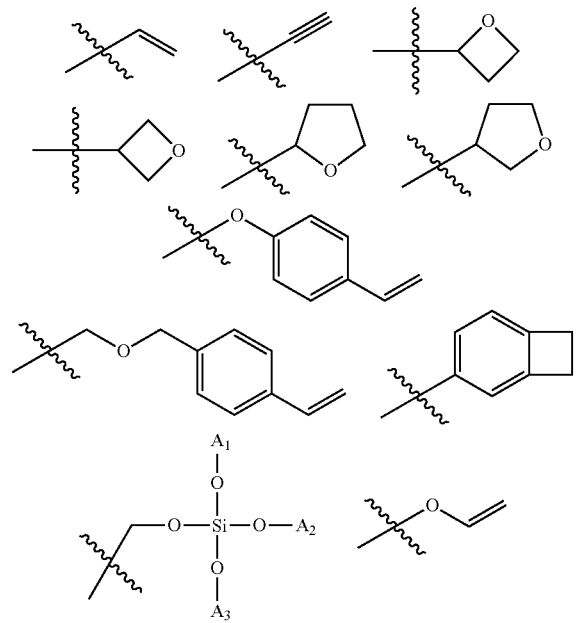

wherein, $A_1$ to $A_3$ are the same as or different from each other, and each independently a substituted or unsubstituted alkyl group having 1 to 6 carbon atoms.

7. The ink composition of claim 1, further comprising a compound represented by the following Chemical Formula 5:

[Chemical Formula 5]

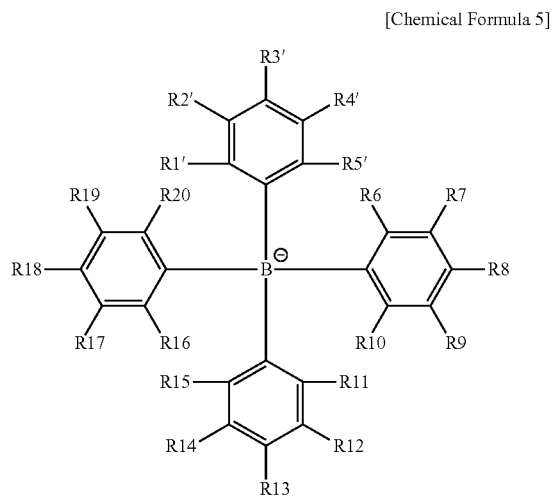

in Chemical Formula 5,

R1' to R5' and R6 to R20 are the same as or different from each other, and each independently hydrogen; deuterium; a halogen group; a nitro group; —C(O)$R_{100}$; —O$R_{101}$; —S$R_{102}$; —SO$_3R_{103}$; —COO$R_{104}$; —OC(O)$R_{105}$; —C(O)NR$_{106}$R$_{107}$; a substituted or unsubstituted alkyl group; a substituted or unsubstituted alkenyl group; a substituted or unsubstituted alkynyl group; a substituted or unsubstituted amine group; a substituted or unsubstituted aryl group; or a substituted or unsubstituted a heterocyclic group; and $R_{100}$ to $R_{107}$ are the same as or different from each other, and each independently hydrogen; deuterium; or a substituted or unsubstituted alkyl group.

8. The ink composition of claim 7, further comprising a cation group represented by any one of the following Chemical Formulae 6 and 7:

[Chemical Formula 6]

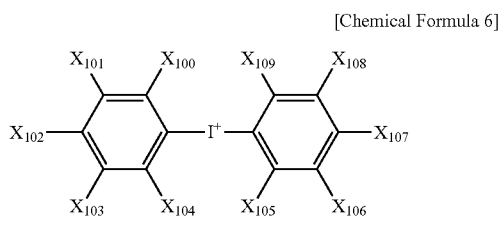

[Chemical Formula 7]

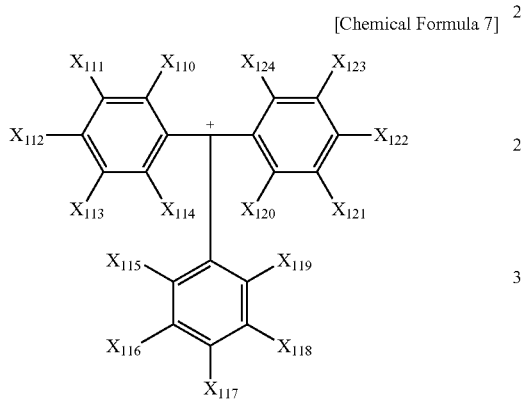

in Chemical Formulae 6 and 7, $X_{100}$ to $X_{124}$ are the same as or different from each other, and each independently hydrogen; a nitrile group; a nitro group; a hydroxyl group; a halogen group; a substituted or unsubstituted alkyl group; a substituted or unsubstituted alkenyl group; a substituted or unsubstituted alkoxy group; a substituted or unsubstituted aryloxy group; a substituted or unsubstituted amine group; a substituted or unsubstituted cycloalkyl group; or a substituted or unsubstituted aryl group.

9. The ink composition of claim 1, wherein the third solvent represented by Chemical Formula 3 is included in less than 50 parts by weight with respect to 100 parts by weight of the solvent.

10. A method for manufacturing an organic light emitting device comprising:

preparing a substrate;

forming a cathode or an anode on the substrate;

forming one or more organic material layers on the cathode or the anode; and forming an anode or a cathode on the organic material layers, wherein the forming of the organic material layers comprises forming one or more organic material layers using the ink composition of claim 1.

11. The method for manufacturing an organic light emitting device of claim 10, wherein the organic material layer formed using the ink composition is formed using an inkjet printing method.

12. The ink composition of claim 1, wherein the charge transferring material or the light emitting material represented by Chemical Formula 4 has any one of the following structures:

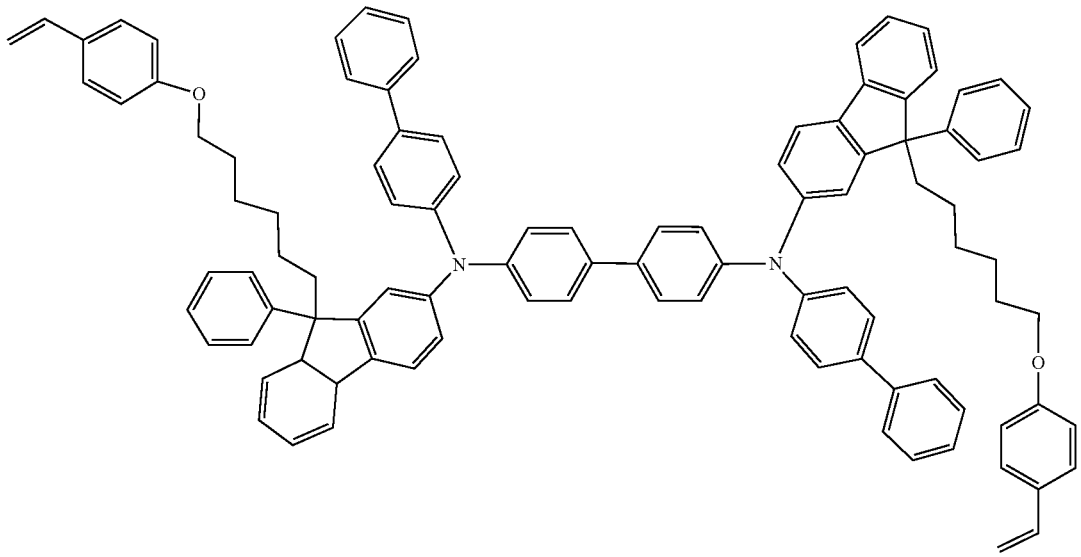

Formula 4-1

Formula 4-2
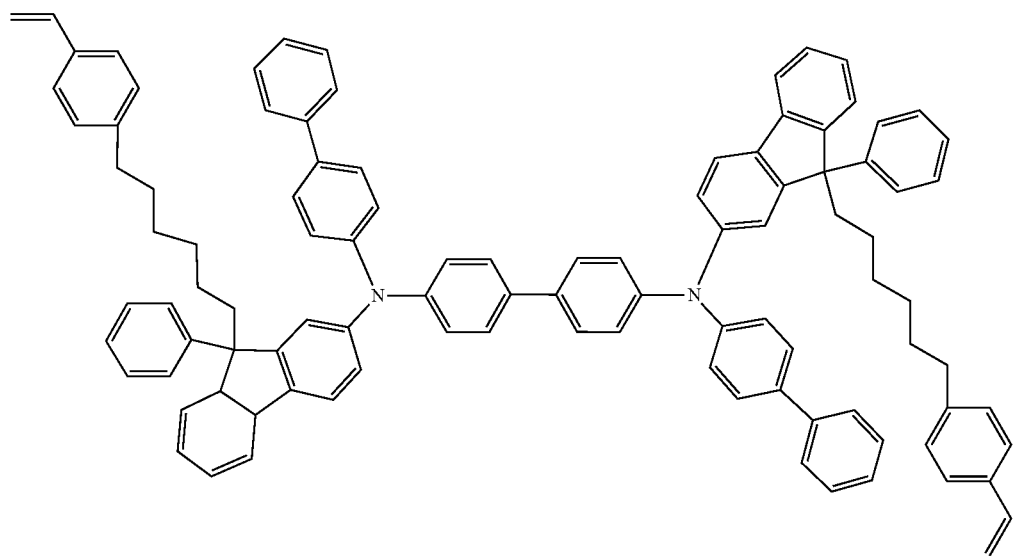
Formula 4-3
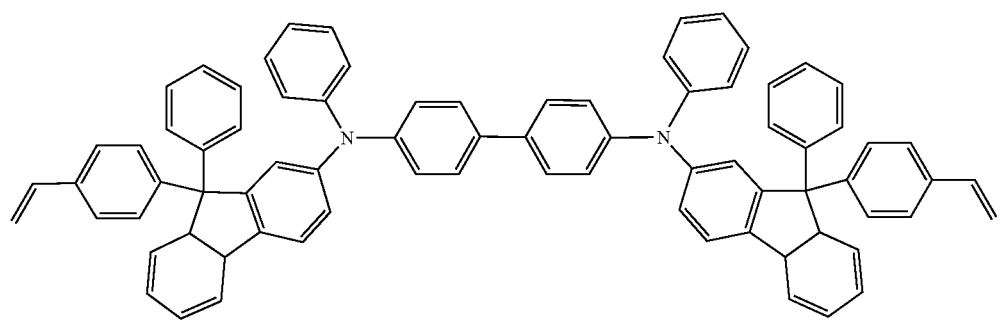
Formula 4-4
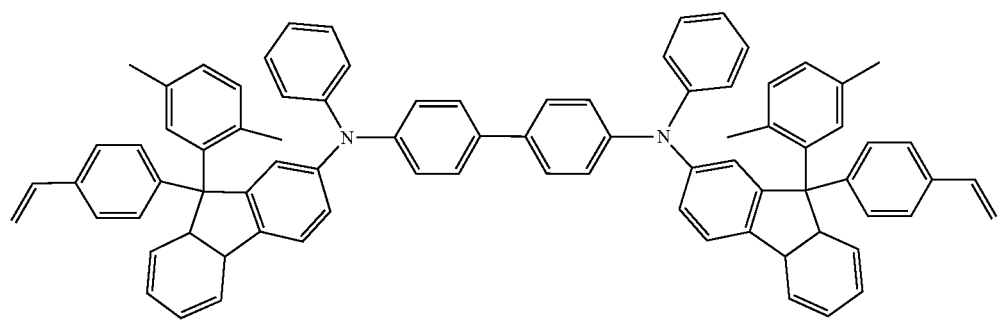
Formula 4-5
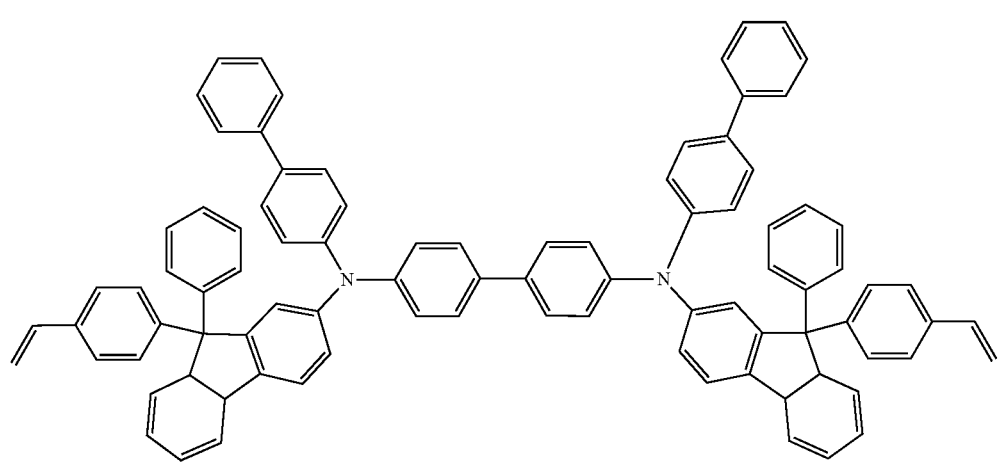

Formula 4-6
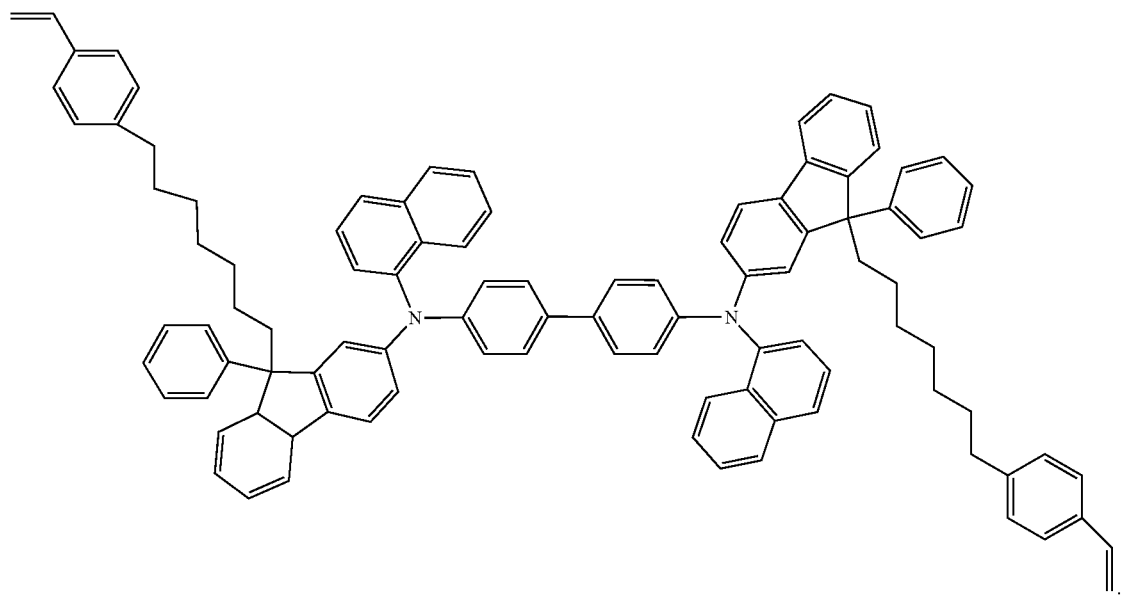
13. The ink composition of claim 1, wherein the compound represented by Chemical Formula 5 has any one of the following structures:
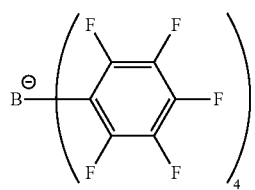
-continued
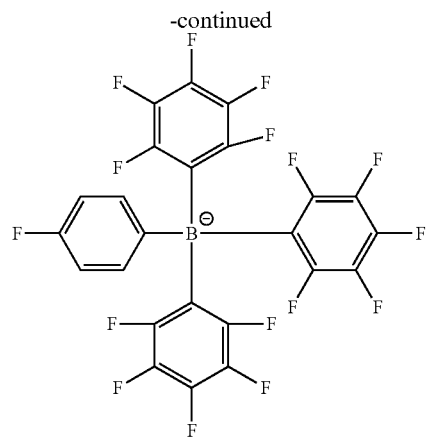
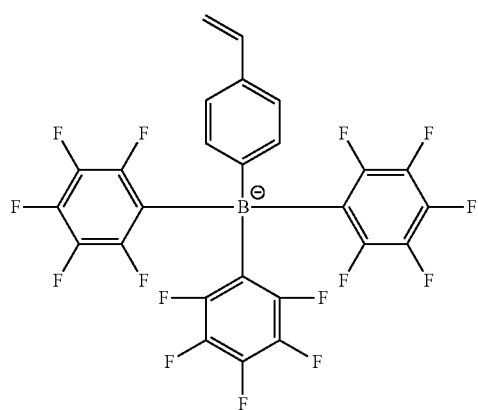
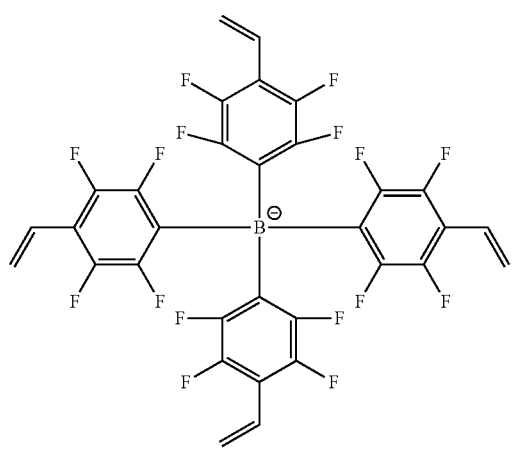

-continued
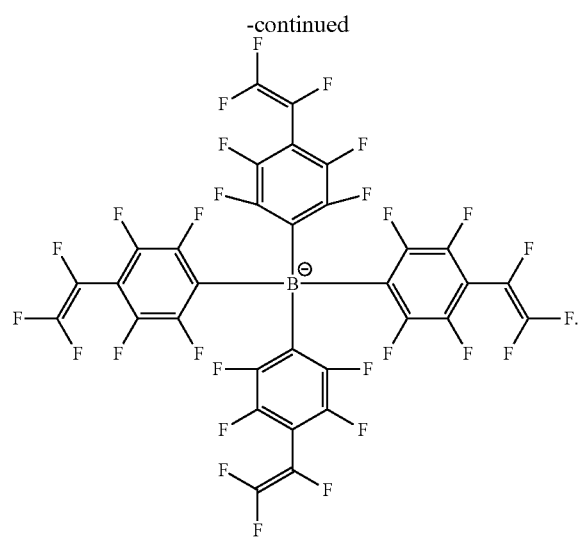
14. The ink composition of claim 1, wherein the compound represented by Chemical Formula 6 or 7 has any one of the following structures:
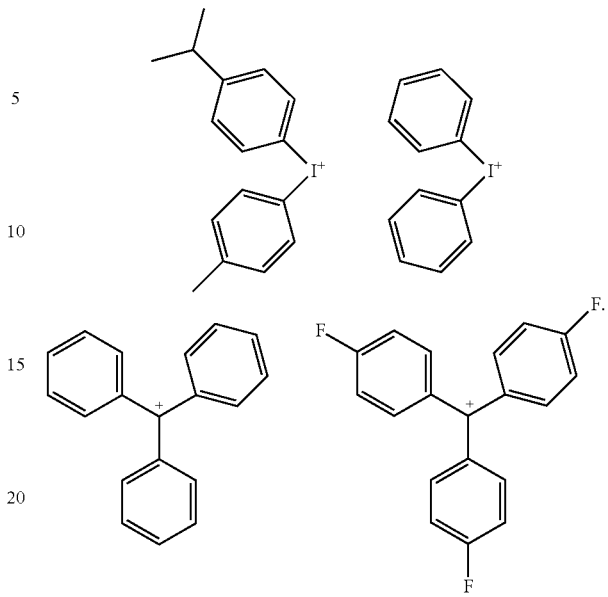
* * * * *